(12) United States Patent
Ichinoseki et al.

(10) Patent No.: US 12,224,345 B2
(45) Date of Patent: Feb. 11, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kentaro Ichinoseki, Nonoichi Ishikawa (JP); Tatsuya Nishiwaki, Nonoichi Ishikawa (JP); Shingo Sato, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/489,389

(22) Filed: Oct. 18, 2023

(65) Prior Publication Data

US 2024/0072167 A1 Feb. 29, 2024

Related U.S. Application Data

(63) Continuation of application No. 17/699,898, filed on Mar. 21, 2022, now Pat. No. 11,830,945, which is a (Continued)

(30) Foreign Application Priority Data

Sep. 17, 2019 (JP) ................................ 2019-168488

(51) Int. Cl.
*H01L 29/78* (2006.01)
*H01L 21/225* (2006.01)
(Continued)

(52) U.S. Cl.
CPC ...... *H01L 29/7827* (2013.01); *H01L 21/2253* (2013.01); *H01L 29/0634* (2013.01);
(Continued)

(58) Field of Classification Search
CPC ............. H01L 29/7827; H01L 21/2253; H01L 29/0634; H01L 29/0878; H01L 29/407;
(Continued)

(56) References Cited

U.S. PATENT DOCUMENTS 6,337,498 B1 1/2002 Hasegawa et al.
8,482,061 B2 7/2013 Nishimura
(Continued)

FOREIGN PATENT DOCUMENTS

JP 3410949 B2 5/2003
JP 2012-059943 A 3/2012
(Continued)

*Primary Examiner* — Douglas W Owens
(74) *Attorney, Agent, or Firm* — Knobbe, Martens, Olson & Bear, LLP

(57) ABSTRACT

According to one embodiment, a semiconductor device includes a first electrode, a first semiconductor region of a first conductivity type, a second electrode, a gate electrode, second semiconductor regions of a second conductivity type, third semiconductor regions of the first conductivity type, and a third electrode. The second electrode is provided in a plurality in second and third directions. Each second electrode opposes a portion of the first semiconductor region in the second and third directions with an insulating layer interposed. The gate electrode is provided around each second electrode. The first semiconductor region includes first regions provided respectively around the second electrodes and the second region provided around the first regions in the second and third directions. Impurity concentration of the first conductivity type in each of the first regions is higher than impurity concentration of the first conductivity type in the second region.

20 Claims, 18 Drawing Sheets

Related U.S. Application Data continuation of application No. 16/816,764, filed on Mar. 12, 2020, now Pat. No. 11,322,612.

(51) Int. Cl.

| | | |
|---|---|---|
| *H01L 29/06* | (2006.01) | |
| *H01L 29/08* | (2006.01) | |
| *H01L 29/40* | (2006.01) | |
| *H01L 29/423* | (2006.01) | |
| *H01L 29/66* | (2006.01) | |

(52) U.S. Cl.
CPC ........ *H01L 29/0878* (2013.01); *H01L 29/407* (2013.01); *H01L 29/42368* (2013.01); *H01L 29/4238* (2013.01); *H01L 29/66666* (2013.01); *H01L 29/7813* (2013.01)

(58) Field of Classification Search
CPC ........... H01L 29/42368; H01L 29/4238; H01L 29/66666; H01L 29/7813; H01L 29/0696; H01L 29/1095; H01L 29/404; H01L 29/66734

See application file for complete search history.

(56) References Cited

U.S. PATENT DOCUMENTS

| | | | |
|---|---|---|---|
| 8,952,450 | B2 | 2/2015 | Nishimura |
| 9,048,215 | B2 | 6/2015 | Asahara |
| 9,142,627 | B2 | 9/2015 | Ono et al. |
| 9,543,396 | B2 | 1/2017 | Georgescu et al. |
| 10,923,582 | B2 * | 2/2021 | Hikasa .................. H01L 29/404 |
| 11,322,612 | B2 | 5/2022 | Ichinoseki et al. |
| 2008/0164516 | A1 * | 7/2008 | Darwish ............. H01L 29/7802 |
| | | | 257/334 |
| 2008/0197406 | A1 | 8/2008 | Parthasarathy et al. |
| 2011/0303925 | A1 | 12/2011 | Nishimura |
| 2012/0061753 | A1 | 3/2012 | Nishiwaki |
| 2012/0061754 | A1 | 3/2012 | Hsieh |
| 2013/0193502 | A1 | 8/2013 | Kocon et al. |
| 2014/0042535 | A1 * | 2/2014 | Darwish ......... H01L 21/823475 |
| | | | 257/334 |
| 2015/0137177 | A1 | 5/2015 | Hutzler et al. |
| 2016/0064497 | A1 | 3/2016 | Darwish et al. |
| 2016/0079376 | A1 | 3/2016 | Hirler et al. |
| 2016/0118493 | A1 | 4/2016 | Liao |
| 2017/0250256 | A1 * | 8/2017 | Siemieniec ......... H01L 29/0696 |
| 2018/0069087 | A1 | 3/2018 | Georgescu et al. |
| 2019/0123197 | A1 * | 4/2019 | Katoh ............... H01L 29/66734 |
| 2020/0091333 | A1 * | 3/2020 | Shimomura ......... H01L 29/401 |
| 2020/0212219 | A1 | 7/2020 | Kim et al. |

FOREIGN PATENT DOCUMENTS

| | | |
|---|---|---|
| JP | 5214288 B2 | 6/2013 |
| JP | 5569162 B2 | 8/2014 |
| JP | 2014-216572 A | 11/2014 |
| JP | 2015-115611 A | 6/2015 |
| JP | 2015-133380 A | 7/2015 |
| JP | 2017-163122 A | 9/2017 |

* cited by examiner

FIG. 9A
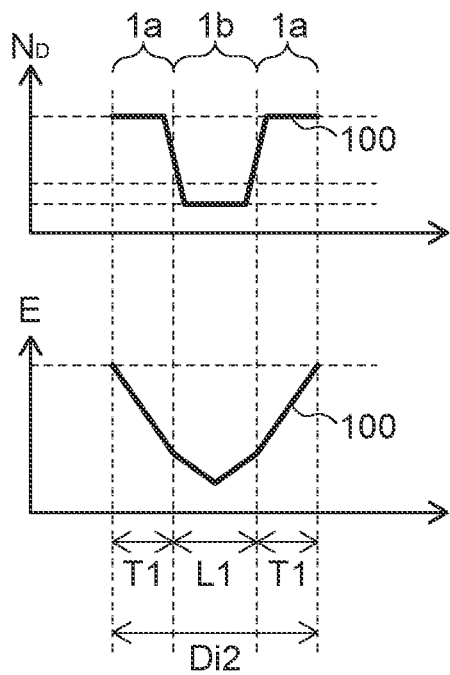
FIG. 9B
FIG. 9C
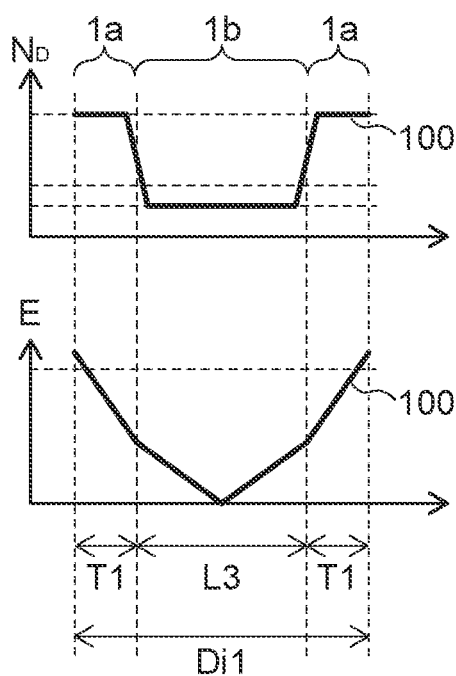
FIG. 9D
FIG. 9E
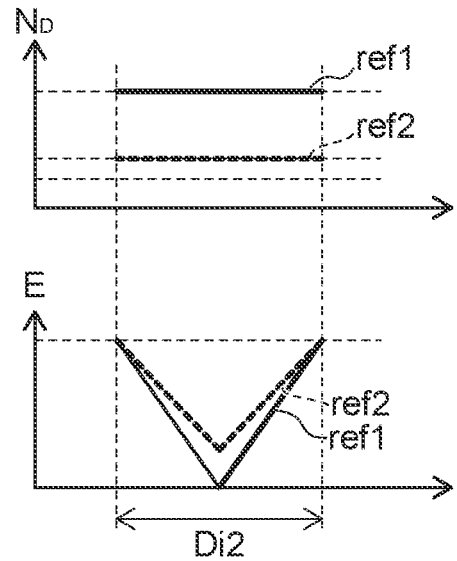
FIG. 9F
FIG. 9G
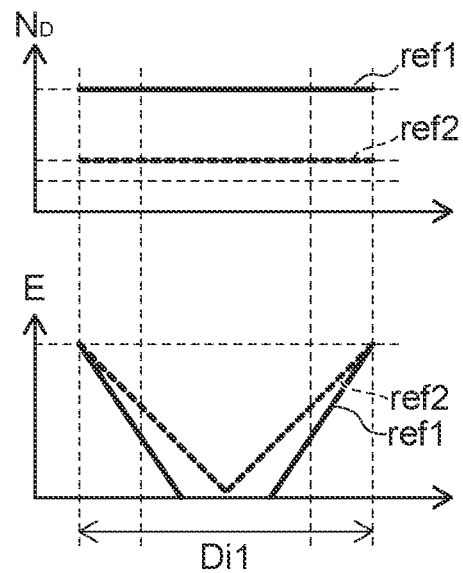
FIG. 9H

SEMICONDUCTOR DEVICE

CROSS-REFERENCE TO RELATED APPLICATIONS

This application is a continuation of U.S. Application Ser. No. 17/699,898 filed Mar. 21, 2022, which is a continuation of U.S. application Ser. No. 16/816,764 filed on Mar. 12, 2020 (now U.S. Pat. No. 11,322,612) and is based upon and claims the benefit of priority from Japanese Patent Application No. 2019-168488, filed on Sep. 17, 2019; the entire contents of which are incorporated herein by reference.

FIELD

Embodiments described herein relate generally to a semiconductor device.

BACKGROUND

There is a semiconductor device that includes a field plate electrode (hereinbelow, called a FP electrode) to enable an increase of the breakdown voltage or a reduction of the ON-resistance. In such a semiconductor device, it is desirable to further increase the breakdown voltage and reduce the ON-resistance.

BRIEF DESCRIPTION OF THE DRAWINGS

FIG. 9A to FIG. 9H are graphs illustrating characteristics of semiconductor devices;

DETAILED DESCRIPTION

Figure 1:
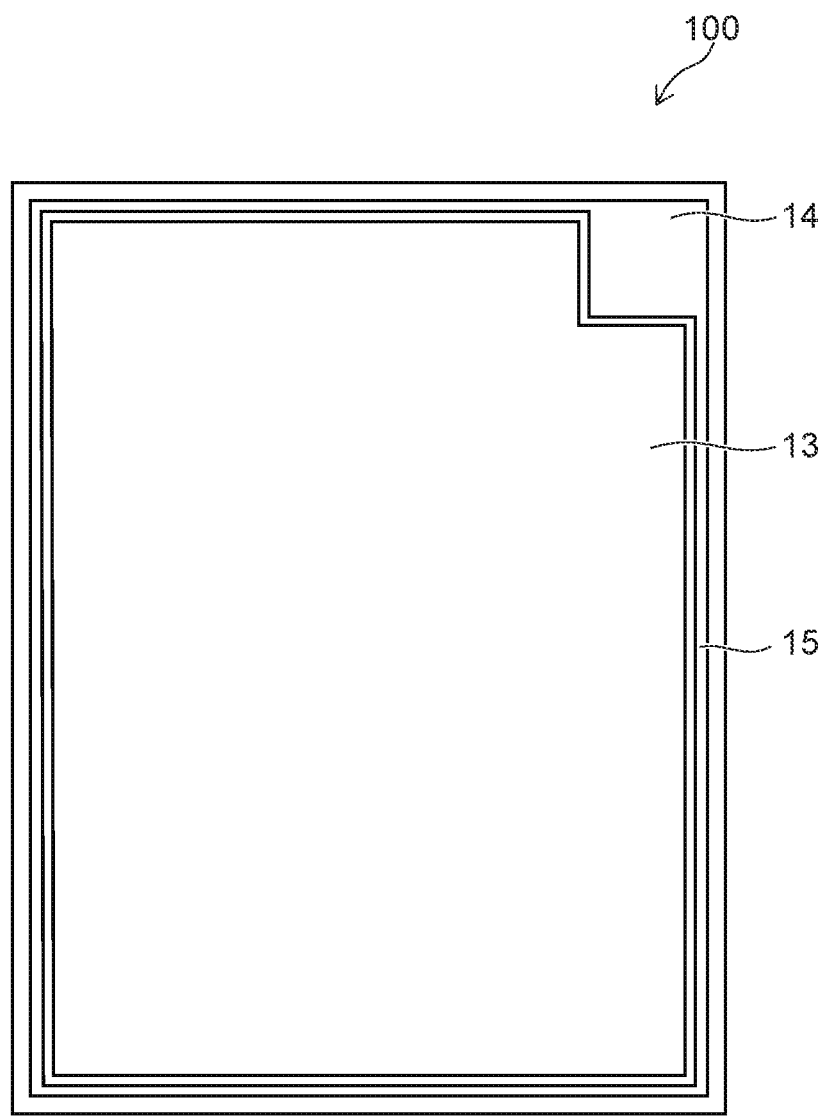
FIG. 1 is a plan view illustrating a semiconductor device according to a first embodiment.
Figure 1:
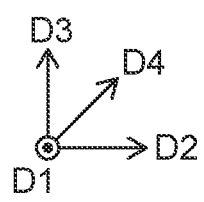

According to one embodiment, a semiconductor device includes a first electrode, a first semiconductor region of a first conductivity type, a second electrode, a gate electrode, a plurality of second semiconductor regions of a second conductivity type, a plurality of third semiconductor regions of the first conductivity type, and a third electrode. The first semiconductor region is provided on the first electrode and electrically connected to the first electrode. The second electrode opposes a portion of the first semiconductor region in a second direction and a third direction with an insulating layer interposed. A plurality of the second electrodes are provided in the second direction and the third direction. The second direction is perpendicular to a first direction from the first electrode toward the first semiconductor region. The third direction is perpendicular to the first direction and crosses the second direction. The gate electrode is provided around each of the second electrodes. The second semiconductor regions oppose the gate electrode with a gate insulating layer interposed, are provided respectively between the gate electrode and the second electrodes. The third semiconductor regions are provided respectively on the second semiconductor regions. The third electrode is provided on the second semiconductor regions and the third semiconductor regions and electrically connected to the second semiconductor regions, the third semiconductor regions, and the second electrodes. The first semiconductor region includes a plurality of first regions provided respectively around the second electrodes in the second direction and the third direction, and a second region provided around the first regions. Impurity concentrations of the first conductivity type in the first regions are higher than an impurity concentration of the first conductivity type in the second region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the drawings and the description recited below, the notations of n+, n−, p+, and p indicate relative levels of the impurity concentrations. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate relative levels of the net impurity concentrations after the impurities are compensated.

In the embodiments described below, each embodiment may be performed by inverting the p-type and the n-type of each semiconductor region.

First Embodiment

FIG. 1 is a plan view illustrating a semiconductor device according to a first embodiment.

FIG. 2 to FIG. 5 are cross-sectional views illustrating portions of the semiconductor device according to the first embodiment.

Figure 2:
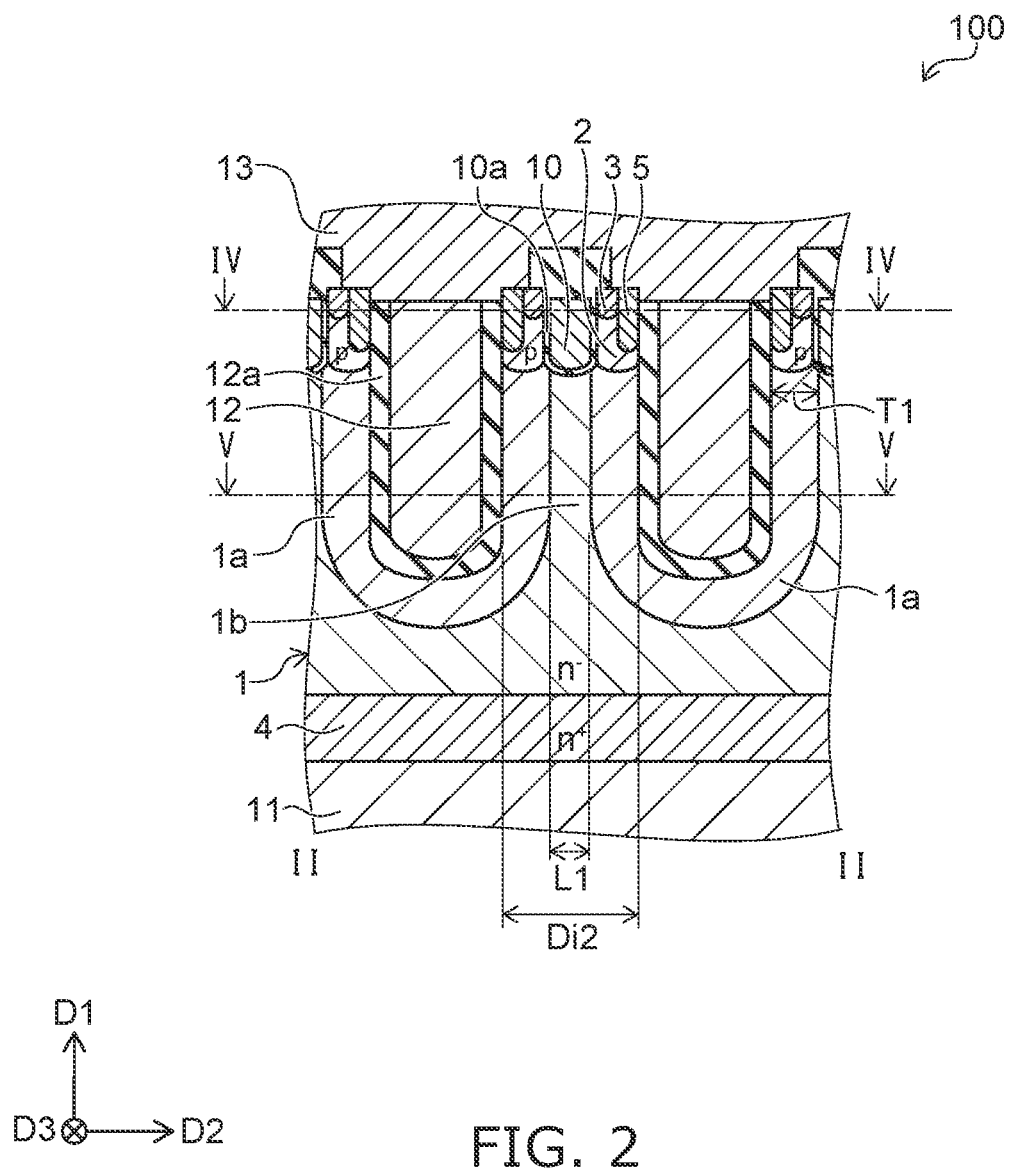
FIG. 2 to FIG. 5 are cross-sectional views illustrating portions of the semiconductor device according to the first embodiment.
Figure 3:
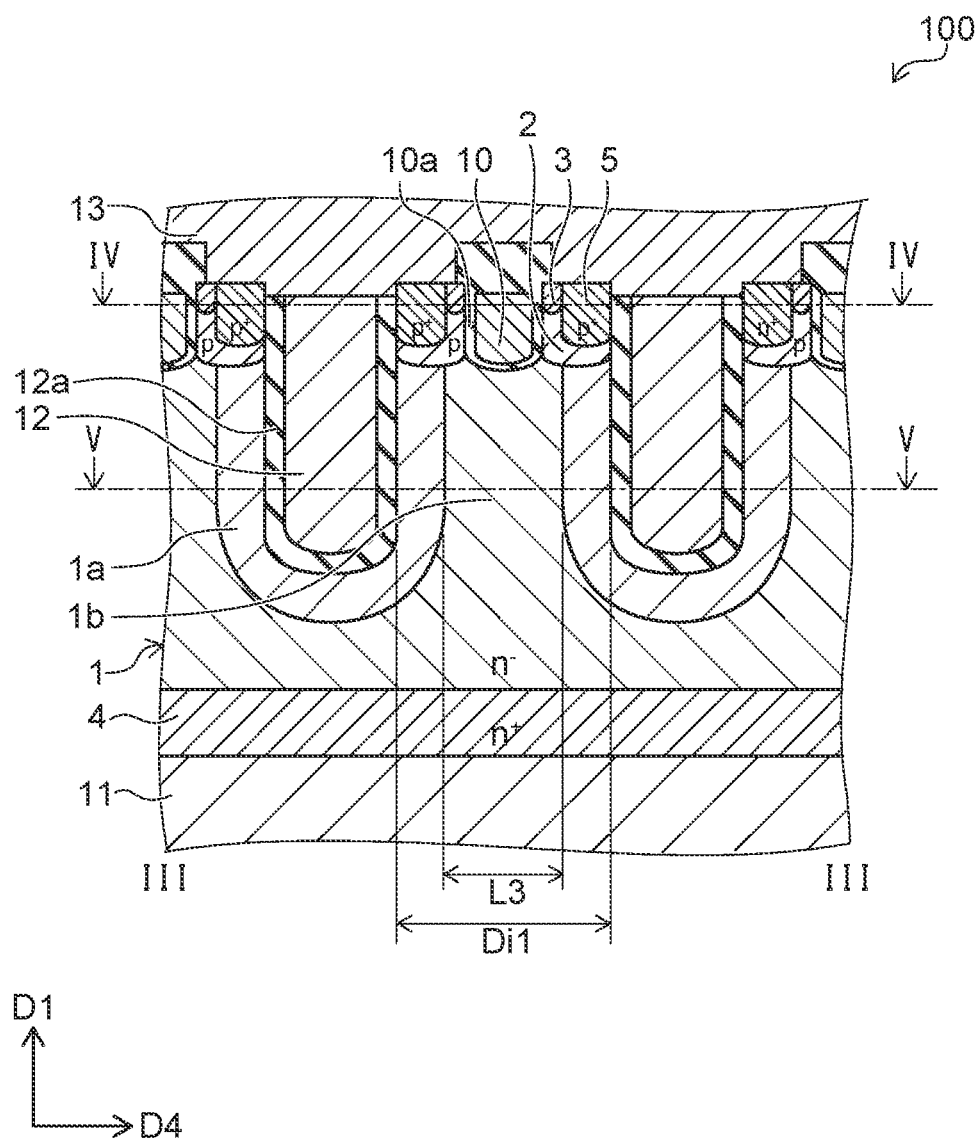
Figure 4:
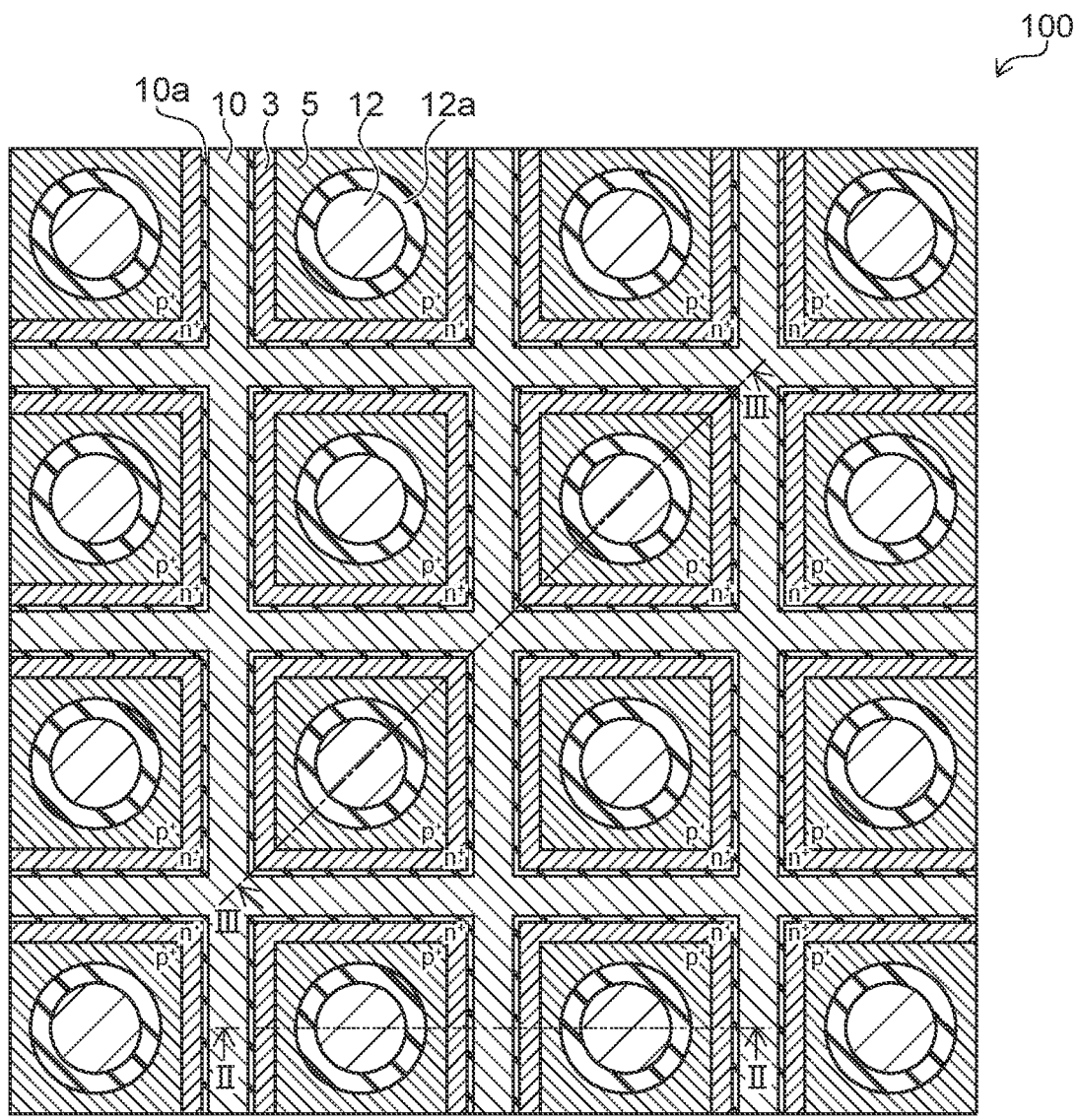
Figure 5:
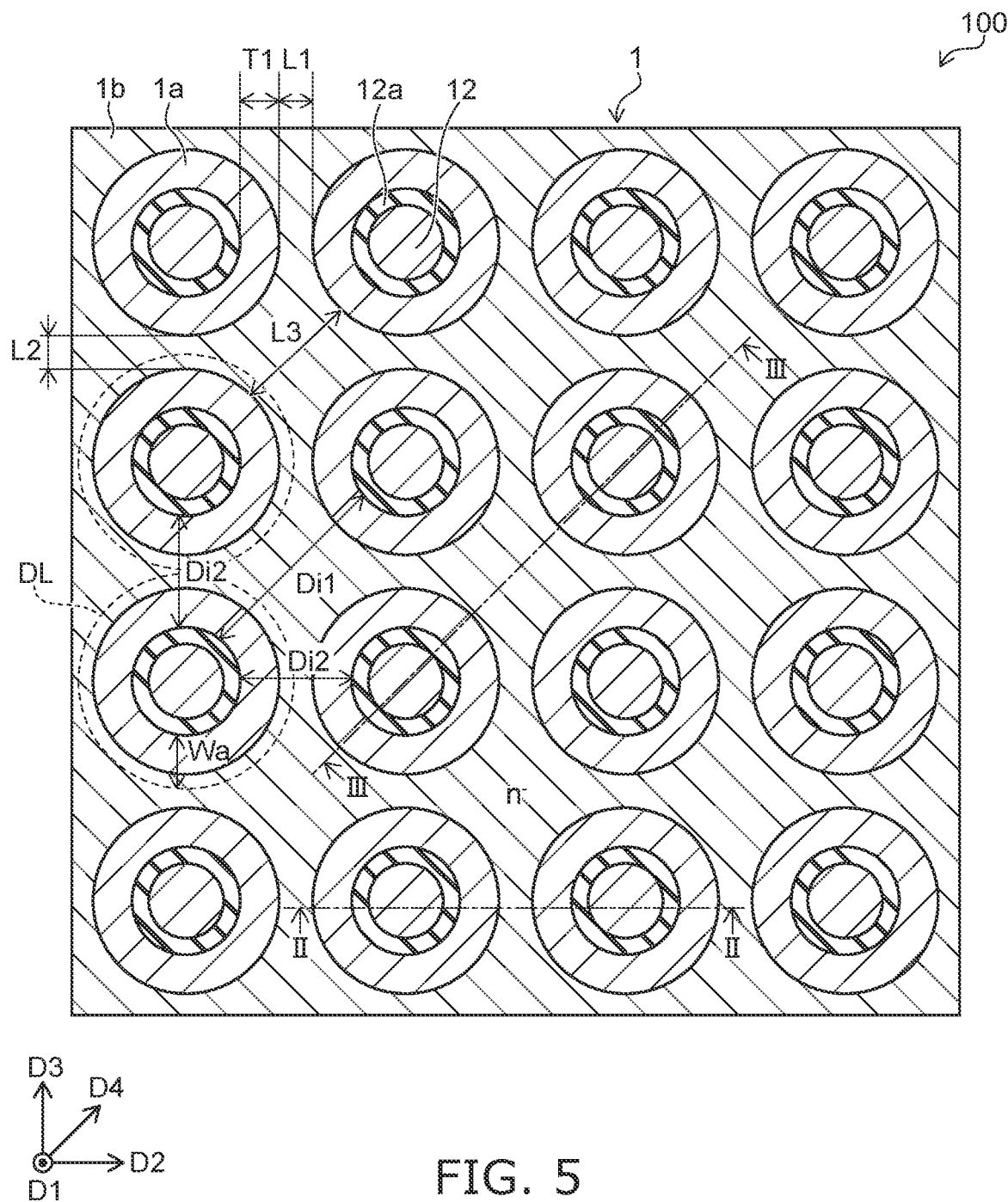

FIG. 2 is a II-II cross-sectional view of FIG. 4 and FIG. 5. FIG. 3 is a III-III cross-sectional view of FIG. 4 and FIG.

5. FIG. 4 is a IV-IV cross-sectional view of FIG. 2 and FIG. 3. FIG. 5 is a V-V cross-sectional view of FIG. 2 and FIG. 3.

The semiconductor device according to the first embodiment is, for example, a Metal Oxide Semiconductor Field Effect Transistor (MOSFET). As illustrated in FIG. 1 to FIG. 5, the semiconductor device 100 according to the first embodiment includes an $n^-$-type (first conductivity type) drift region 1 (a first semiconductor region), a p-type (second conductivity type) base region 2 (a second semiconductor region), an $n^+$-type source region 3 (a third semiconductor region), an $n^+$-type drain region 4, a $p^+$-type contact region 5, a drain electrode 11 (a first electrode), a FP electrode 12 (a second electrode), a source electrode 13 (a third electrode), and a gate pad 14.

A first direction D1, a second direction D2, and a third direction D3 are used in the description of the embodiment. The direction from the drain electrode 11 toward the $n^-$-type drift region 1 is taken as a first direction D1. One direction perpendicular to the first direction D1 is taken as a second direction D2. A direction which is perpendicular to the first direction D1 and crosses the second direction D2 is taken as a third direction D3. For the description, the direction from the drain electrode 11 toward the $n^-$-type drift region 1 is called "up;" and the reverse direction is called "down." These directions are based on the relative positional relationship between the drain electrode 11 and the $n^-$-type drift region 1 and are independent of the direction of gravity.

As illustrated in FIG. 1, the source electrode 13 and the gate pad 14 are provided at the upper surface of the semiconductor device 100. The source electrode 13 and the gate pad 14 are electrically isolated from each other. In the semiconductor device 100, a gate interconnect 15 which surrounds the source electrode 13 is connected to the gate pad 14.

As illustrated in FIG. 2 and FIG. 3, the drain electrode 11 is provided at the lower surface of the semiconductor device 100. The $n^-$-type drift region 1 is provided on the drain electrode 11 with the $n^+$-type drain region 4 interposed. The $n^-$-type drift region 1 is electrically connected to the drain electrode 11 via the $n^+$-type drain region 4.

As illustrated in FIG. 2 to FIG. 5, multiple FP electrodes 12 are provided in the second direction D2 and the third direction D3. The multiple FP electrodes 12 are separated from each other. A gate electrode 10 is provided around each of the FP electrodes 12. The gate electrode 10 extends in the third direction D3 between the FP electrodes 12 adjacent to each other in the second direction D2. Also, the gate electrode 10 extends in the second direction D2 between the FP electrodes 12 adjacent to each other in the third direction D3. The gate electrode 10 is electrically connected to the gate interconnect 15.

As illustrated in FIG. 2, FIG. 3, and FIG. 5, the FP electrode 12 opposes a portion of the $n^-$-type drift region 1 in the second direction D2 and the third direction D3 with an insulating layer 12a interposed. As illustrated in FIG. 2 and FIG. 3, multiple p-type base regions 2 are provided on the $n^-$-type drift region 1. The multiple p-type base regions 2 are provided respectively between the gate electrode 10 and the multiple FP electrodes 12. The multiple $n^+$-type source regions 3 and the multiple $p^+$-type contact regions 5 are selectively provided respectively on the multiple p-type base regions 2.

Each of the p-type base regions 2 opposes the gate electrode 10 in the second direction D2 and the third direction D3 with a gate insulating layer 10a interposed. In the semiconductor device 100, the gate electrode 10 also opposes the multiple $n^+$-type source regions 3 and a portion of the $n^-$-type drift region 1 in the second direction D2 and the third direction D3.

The source electrode 13 is provided on the $n^+$-type source region 3, the $p^+$-type contact region 5, the gate electrode 10, and the FP electrode 12. The source electrode 13 is electrically connected to the $n^+$-type source region 3, the $p^+$-type contact region 5, and the FP electrode 12. The p-type base region 2 is electrically connected to the source electrode 13 via the $p^+$-type contact region 5. An insulating layer is provided between the gate electrode 10 and the source electrode 13; and these electrodes are electrically isolated.

Operations of the semiconductor device 100 will now be described.

A voltage that is not less than a threshold is applied to the gate electrode 10 in a state in which a voltage that is positive with respect to the source electrode 13 is applied to the drain electrode 11. Thereby, a channel (an inversion layer) is formed in the p-type base region 2; and the semiconductor device 100 is set to the ON-state. Electrons from the source electrode 13 pass through the channel and flow toward the drain electrode 11. Subsequently, when the voltage applied to the gate electrode 10 becomes lower than the threshold, the channel in the p-type base region 2 disappears; and the semiconductor device 100 is set to the OFF-state.

When the semiconductor device 100 is switched to the OFF-state, the voltage that is positive with respect to the source electrode 13 and is applied to the drain electrode 11 increases. Due to the increase of the positive voltage, a depletion layer spreads from the interface between the $n^-$-type drift region 1 and the insulating layer 12a toward the $n^-$-type drift region 1. The breakdown voltage of the semiconductor device 100 can be increased by the spreading of the depletion layer. Or, the ON-resistance of the semiconductor device 100 can be reduced while maintaining the breakdown voltage of the semiconductor device 100 by increasing the n-type impurity concentration in the $n^-$-type drift region 1.

When the depletion layer spreads to the $n^-$-type drift region 1, carriers (electrons and holes) that are generated by impact ionization, etc., are accelerated inside the depletion layer; and avalanche breakdown occurs. When avalanche breakdown occurs, the electrons pass through the $n^+$-type drain region 4 and are discharged from the drain electrode 11. The holes pass through the $p^+$-type contact region 5 and are discharged toward the source electrode 13.

As illustrated in FIG. 2, FIG. 3, and FIG. 5, the $n^-$-type drift region 1 includes multiple first regions 1a and a second region 1b. The multiple first regions 1a are provided respectively around the multiple FP electrodes 12. The second region 1b is provided around the multiple FP electrodes 12. At least a portion of the second region 1b is positioned under the gate electrode 10. The n-type impurity concentrations in the first regions 1a are higher than the n-type impurity concentration in the second region 1b and lower than the p-type impurity concentration in the p-type base region 2. As illustrated in FIG. 2, a thickness T1 of the first region 1a between the second region 1b and the FP electrode 12 is substantially uniform around the FP electrode 12.

Examples of the materials of the components of the semiconductor device 100 will now be described.

The $n^-$-type drift region 1, the p-type base region 2, the $n^+$-type source region 3, the $n^+$-type drain region 4, and the $p^+$-type contact region 5 include silicon, silicon carbide, gallium nitride, or gallium arsenide as semiconductor materials. In the case where silicon is used as the semiconductor material, arsenic, phosphorus, or antimony can be used as the n-type impurity. Boron can be used as the p-type impurity.

The gate electrode 10 and the FP electrode 12 include a conductive material such as polysilicon, etc. An impurity may be added to the conductive material.

The gate insulating layer 10a and the insulating layer 12a include an insulating material such as a silicon oxide, etc.

The drain electrode 11 and the source electrode 13 include a metal such as aluminum, copper, etc.

An example of a method for manufacturing the semiconductor device 100 according to the first embodiment will now be described.

FIG. 6A to FIG. 8B are process cross-sectional views illustrating manufacturing processes of the semiconductor device according to the first embodiment. FIG. 6A to FIG. 8B illustrate manufacturing processes in a cross section parallel to the first direction D1 and the second direction D2.

Figure 6A:
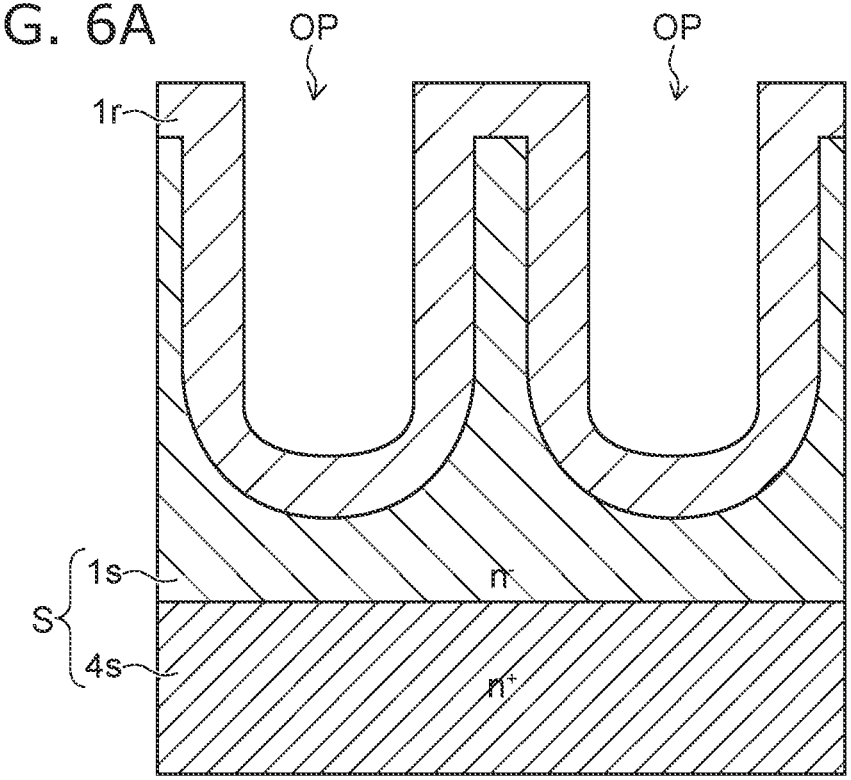
FIG. 6A, FIG. 6B, FIG. 7A, FIG. 7B, FIG. 8A, and FIG. 8B are process cross-sectional views illustrating manufacturing processes of the semiconductor device according to the first embodiment.

A semiconductor substrate S which includes an $n^+$-type semiconductor layer 4s and an $n^-$-type semiconductor layer 1s provided on the $n^+$-type semiconductor layer 4s are prepared. Openings OP are formed by removing a portion of the $n^-$-type semiconductor layer 1s. Multiple openings OP are formed in the second direction D2 and the third direction D3. A region 1r is formed as illustrated in FIG. 6A along the inner surfaces of the openings OP. The n-type impurity concentration in the region 1r is higher than the n-type impurity concentration in the $n^-$-type semiconductor layer 1s and lower than the n-type impurity concentration in the $n^+$-type semiconductor layer 4s.

For example, the region 1r is formed by ion-implanting an n-type impurity into the inner surfaces of the openings OP. Or, an impurity layer that includes the n-type impurity may be formed inside the openings OP. The region 1r is formed by diffusing the n-type impurity from the impurity layer into the $n^-$-type semiconductor layer 1s. The region 1r may be formed by exposing the $n^-$-type semiconductor layer 1s to a plasma atmosphere of the n-type impurity. The region 1r may be formed by epitaxially growing a semiconductor layer including the n-type impurity along the inner surfaces of the openings OP. Or, the region 1r may be formed by appropriately combining these methods.

Figure 6B:
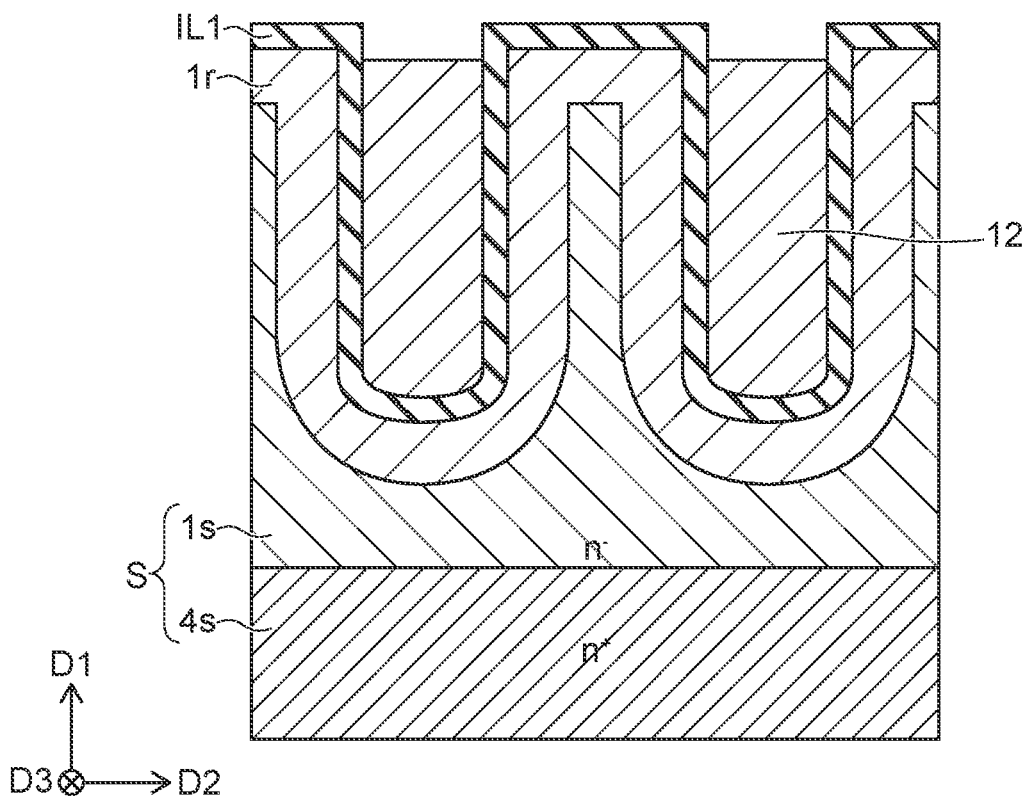

After forming the region 1r by any of the methods described above, an insulating layer IL1 is formed along the inner surfaces of the multiple openings OP and the upper surface of the $n^-$-type semiconductor layer 1s by thermal oxidation. A conductive layer that fills the multiple openings OP is formed on the insulating layer IL1. For example, the conductive layer includes polysilicon to which an impurity is added. The FP electrodes 12 are formed respectively inside the openings OP as illustrated in FIG. 6B by causing the upper surface of the conductive layer to recede.

Figure 7A:
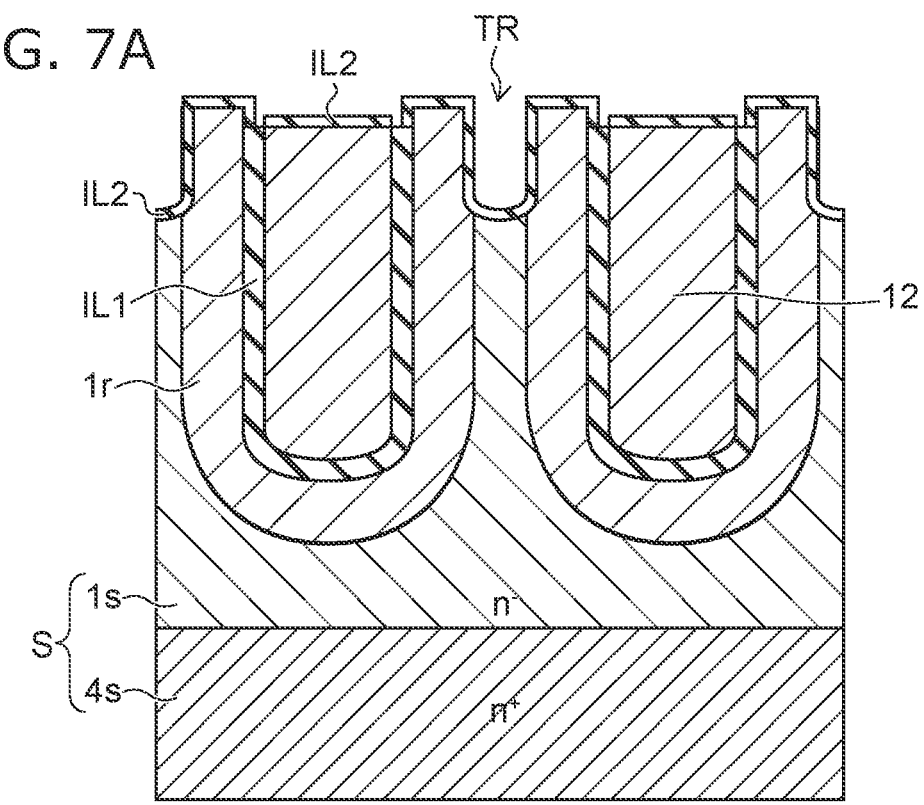

A portion of the insulating layer IL1 is removed to expose the upper surface of the $n^-$-type semiconductor layer 1s. A trench TR which extends in the second direction D2 or the third direction D3 is formed between the openings OP. The trench TR is formed to be shallower than the openings OP. As illustrated in FIG. 7A, an insulating layer IL2 is formed along the inner surface of the trench TR, the upper surfaces of the p-type base regions 2, and the upper surfaces of the FP electrodes 12 by thermal oxidation. The insulating layer IL2 is formed to be thinner than the insulating layer IL1.

Figure 7B:
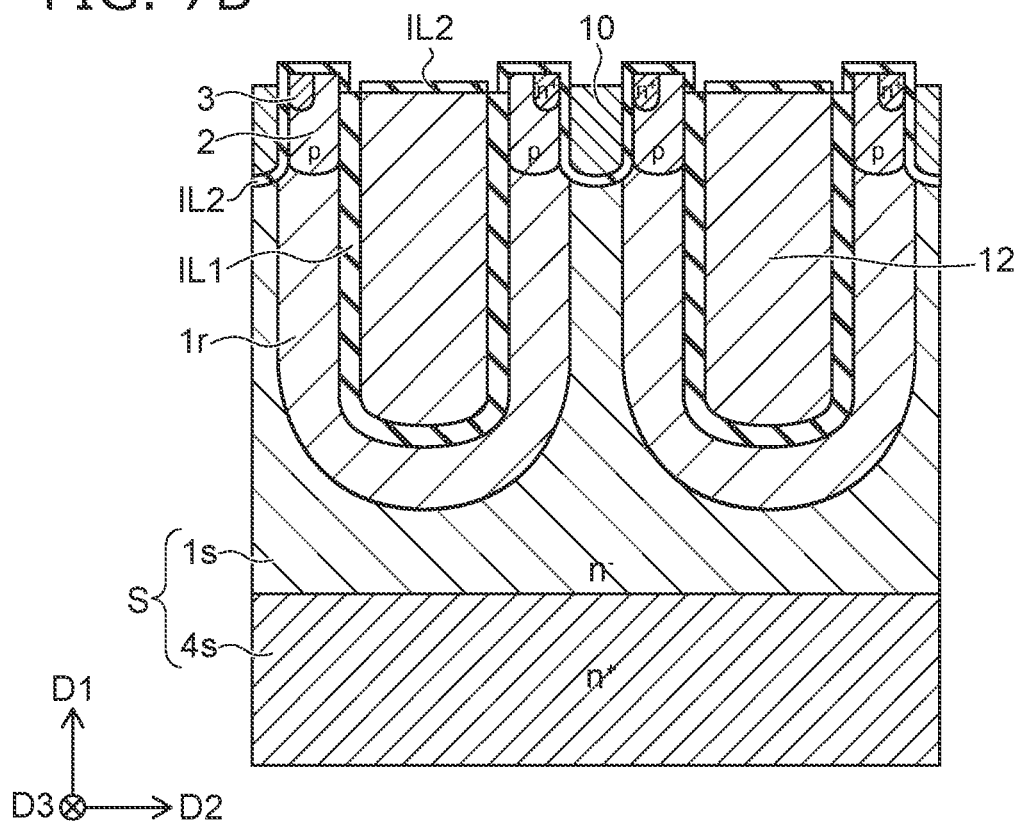

A conductive layer that includes polysilicon is formed on the insulating layer IL2; and the upper surface of the conductive layer is caused to recede. Thereby, the gate electrode 10 is formed around the upper portions of the FP electrodes 12. A p-type impurity is ion-implanted into the upper surface of the $n^-$-type semiconductor layer 1s. Thereby, the multiple p-type base regions 2 are formed respectively between the gate electrode 10 and the upper portions of the multiple FP electrodes 12. The $n^+$-type source regions 3 are formed as illustrated in FIG. 7B by ion-implanting an n-type impurity into portions of the p-type base regions 2.

Figure 8A:
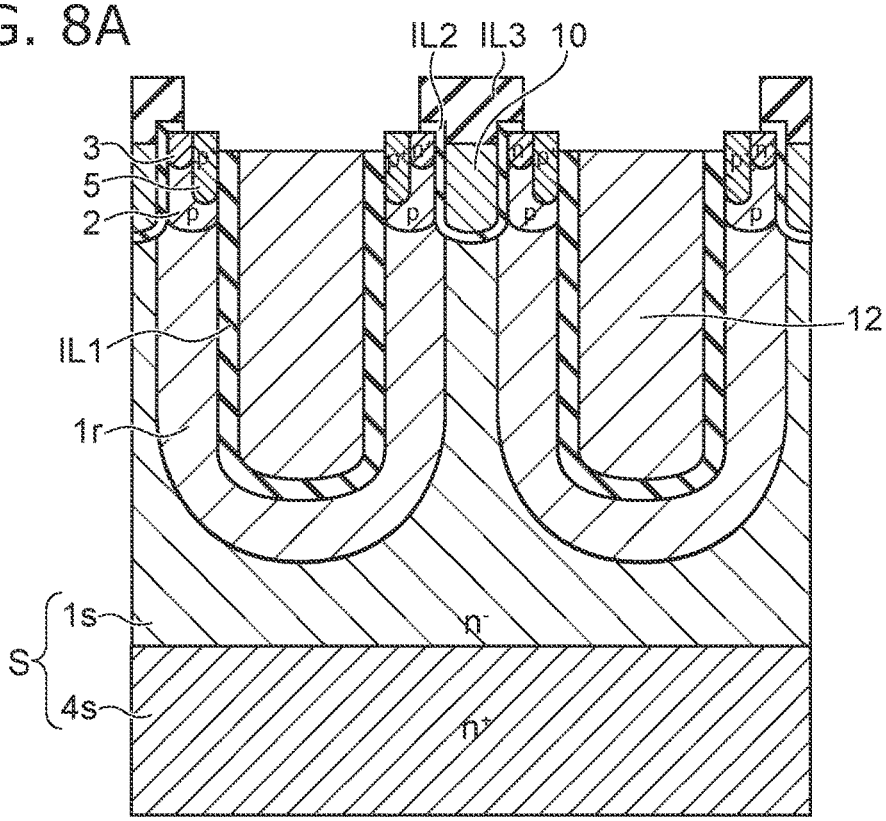

An insulating layer IL3 is formed on the insulating layer IL2 and the gate electrode 10. A portion of the insulating layer IL2 and a portion of the insulating layer IL3 are removed to expose the upper surfaces of the multiple p-type base regions 2 and the upper surfaces of the multiple FP electrodes 12. The $p^+$-type contact regions 5 are formed as illustrated in FIG. 8A by ion-implanting a p-type impurity into portions of the p-type base region 2.

Figure 8B:
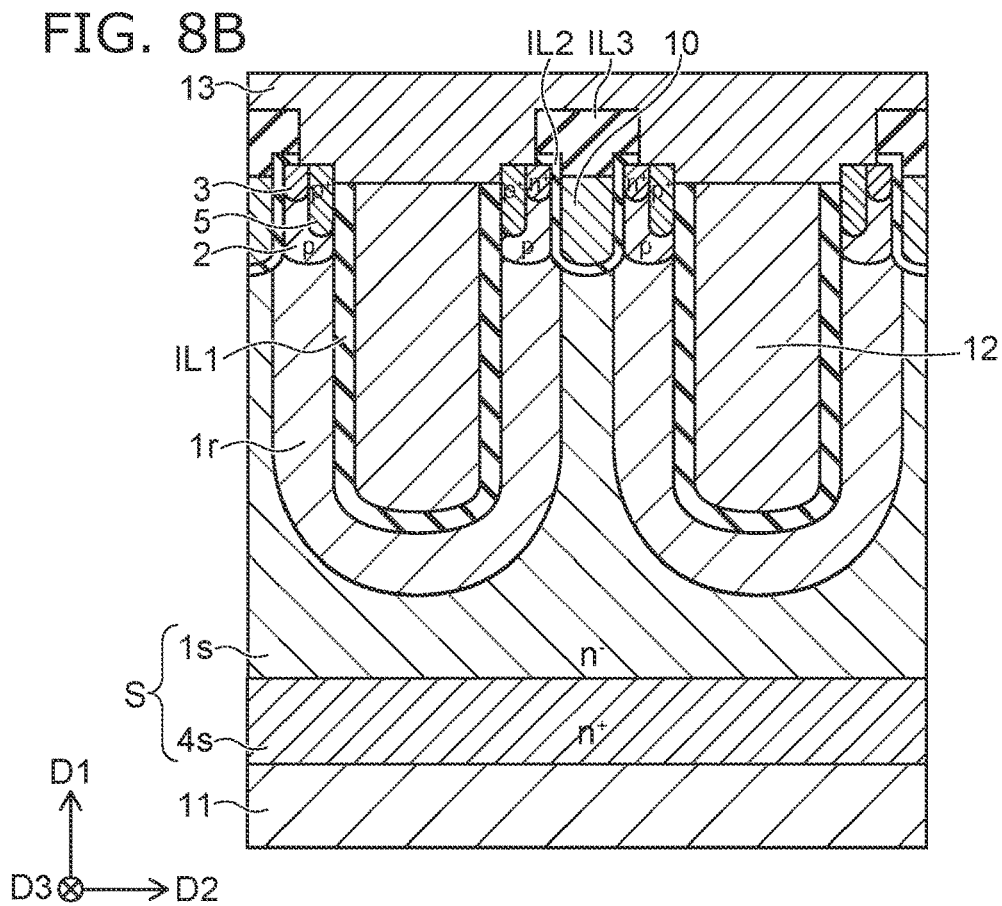

A metal layer is formed on the multiple FP electrodes 12 and the insulating layer IL3. The source electrode 13 is formed by patterning the metal layer. The back surface of the $n^+$-type semiconductor layer 4s is polished until the $n^+$-type semiconductor layer 4s has a prescribed thickness. Subsequently, as illustrated in FIG. 8B, the semiconductor device 100 illustrated in FIG. 1 to FIG. 5 is manufactured by forming the drain electrode 11 at the back surface of the $n^+$-type semiconductor layer 4s.

In the manufacturing processes described above, chemical vapor deposition (CVD) or sputtering can be used to form the components. Wet etching, chemical dry etching (CDE), or reactive ion etching (RIE) can be used to remove portions of the components. Wet etching, CDE, or chemical mechanical polishing (CMP) can be used to planarize the upper surfaces of the components or cause the upper surfaces of the components to recede.

Effects of the first embodiment will now be described.

As described above, when the semiconductor device 100 is switched from the ON-state to the OFF-state, a depletion layer spreads around each of the FP electrodes 12. At this time, as illustrated in FIG. 5, when a depletion layer DL having a width Wa spreads, the $n^-$-type drift region 1 is completely depleted between the FP electrodes 12 in the second direction D2 and the third direction D3.

Here, a direction that is perpendicular to the first direction D1 and crosses the second direction D2 and the third direction D3 is taken as a fourth direction D4. The angle between the second direction D2 and the fourth direction D4 is equal to the angle between the third direction D3 and the fourth direction D4. A distance Di1 between the insulating layers 12a adjacent to each other in the fourth direction D4 is longer than a distance Dig between the insulating layers 12a adjacent to each other in the second direction D2 or the third direction D3. Accordingly, even if a depletion layer having the width Wa spreads in the fourth direction D4, the $n^-$-type drift region 1 is not depleted completely between the FP electrodes 12 adjacent to each other in the fourth direction D4. The breakdown voltage of the semiconductor device 100 decreases when the $n^-$-type drift region 1 between the FP electrodes 12 is not depleted completely.

To completely deplete the $n^-$-type drift region 1 between the FP electrodes 12 in the fourth direction D4, there is a method of reducing the n-type impurity of the $n^-$-type drift region 1. However, according to such a method, the electrical resistance of the $n^-$-type drift region 1 increases. Therefore, the ON-resistance of the semiconductor device 100 increases.

For the problems described above, the $n^-$-type drift region 1 includes the multiple first regions 1a and the second region 1b in the semiconductor device 100 according to the first embodiment. The multiple first regions 1a are provided respectively around the multiple FP electrodes 12. The second region 1*b* is provided around the multiple first regions 1*a*. Therefore, a length L3 of the second region 1*b* between the FP electrodes 12 adjacent to each other in the fourth direction D4 is longer than a length L1 of the second region 1*b* between the FP electrodes 12 adjacent to each other in the second direction D2. The length L3 is longer than a length L2 of the second region 1*b* between the FP electrodes 12 adjacent to each other in the third direction D3.

Also, the n-type impurity concentration in the first region 1*a* is higher than the n-type impurity concentration in the second region 1*b*. Accordingly, the depletion layer spreads easily in the second region 1*b* compared to the first region 1*a*. Therefore, according to the first embodiment, compared to when the n-type impurity concentration in the $n^-$-type drift region 1 is uniform, the $n^-$-type drift region 1 between the FP electrodes 12 in the fourth direction D4 is depleted easily even when the length L3 is longer than the length L1 and longer than the length L2.

Effects of the first embodiment will now be described more specifically with reference to FIG. 9A to FIG. 9H.

FIG. 9A to FIG. 9H are graphs illustrating characteristics of semiconductor devices.

FIG. 9A to FIG. 9D illustrate characteristics of the semiconductor device according to the first embodiment. FIG. 9E to FIG. 9H illustrate characteristics of two semiconductor devices according to reference examples.

In the semiconductor device ref1 and ref2 according to the reference examples, the n-type impurity concentration in the $n^-$-type drift region 1 is uniform. For example, in the semiconductor device ref1, the first region 1*a* is provided in the entire $n^-$-type drift region 1. In the semiconductor device ref2, the n-type impurity concentration in the $n^-$-type drift region 1 is lower than an intermediate value between the n-type impurity concentration in the first region 1*a* and the n-type impurity concentration in the second region 1*b*.

FIG. 9A and FIG. 9E illustrate an n-type impurity concentration ND in the $n^-$-type drift region 1 between the FP electrodes 12 adjacent to each other in the second direction D2. FIG. 9B and FIG. 9F illustrate an electric field intensity E in the $n^-$-type drift region 1 between the FP electrodes 12 adjacent to each other in the second direction D2. FIG. 9C and FIG. 9G illustrate the n-type impurity concentration ND in the $n^-$-type drift region 1 between the FP electrodes 12 adjacent to each other in the fourth direction D4. FIG. 9D and FIG. 9H illustrate the electric field intensity E in the $n^-$-type drift region 1 between the FP electrodes 12 adjacent to each other in the fourth direction D4. The breakdown voltage of each semiconductor device is expressed by the integral of the electric field intensity.

In the semiconductor device ref1 as illustrated in FIG. 9E and FIG. 9G, the n-type impurity concentration in the $n^-$-type drift region 1 is uniform and high. Therefore, the ON-resistance of the semiconductor device ref1 is lower than that of the semiconductor device 100.

On the other hand, as illustrated in FIG. 9F, the electric field intensity in the $n^-$-type drift region 1 decreases uniformly. In the $n^-$-type drift region 1 between the FP electrodes 12 adjacent to each other in the fourth direction D4 as illustrated in FIG. 9H, the electric field intensity decreases to 0. Therefore, the breakdown voltage of the semiconductor device ref1 decreases greatly compared to the semiconductor device 100.

In the semiconductor device ref2 as illustrated in FIG. 9F and FIG. 9H, the $n^-$-type drift region 1 between the FP electrodes 12 depletes completely in all directions. Therefore, the breakdown voltage of the semiconductor device ref2 is higher than the breakdown voltage of the semiconductor device ref1. However, because the n-type impurity concentration in the $n^-$-type drift region 1 is uniform and low, the ON-resistance of the semiconductor device ref2 increases greatly compared to the ON-resistance of the semiconductor device 100 and the ON-resistance of the semiconductor device ref2.

In the semiconductor device 100 according to the first embodiment as illustrated in FIG. 9A, the n-type impurity concentration in the first region 1*a* is higher than the n-type impurity concentration in the second region 1*b*. Therefore, the electrical resistivity of the first region 1*a* in the ON-state can be reduced to about the same as the electrical resistivity of the $n^-$-type drift region 1 of the semiconductor device ref1. Thereby, the ON-resistance of the semiconductor device 100 can be reduced more than the ON-resistance of the semiconductor device ref2.

Also, the second region 1*b* depletes easily compared to the first region 1*a*. Therefore, as illustrated in FIG. 9B, the decrease of the electric field intensity in the second region 1*b* can be more gradual than the decrease of the electric field intensity in the $n^-$-type drift region 1 of the semiconductor device ref1. Thereby, the breakdown voltage of the semiconductor device 100 can be larger than the breakdown voltage of the semiconductor device ref1.

In other words, according to the first embodiment, compared to the reference examples, it is possible to increase the breakdown voltage and reduce the ON-resistance while avoiding the large ON-resistance increase and the large breakdown voltage decrease.

The first region 1*a* may be provided around the FP electrode 12 only in the second direction D2 and the third direction D3. In other words, the first region 1*a* may not be provided between the drain electrode 11 and the FP electrode 12 in the first direction D1; and the second region 1*b* may be provided at the bottom portion vicinity of the insulating layer 12*a*. In such a case as well, it is possible to increase the breakdown voltage and reduce the ON-resistance because the depletion layer spreads easily toward the fourth direction D4.

However, electrons flow also at the bottom portion vicinity of the insulating layer 12*a* when the semiconductor device 100 is in the ON-state. The electrical resistance for the flow of the electrons can be reduced by providing the first region 1*a* at the bottom portion vicinity of the insulating layer 12*a*. In other words, the ON-resistance of the semiconductor device 100 can be reduced further.

First Modification

Figure 10:
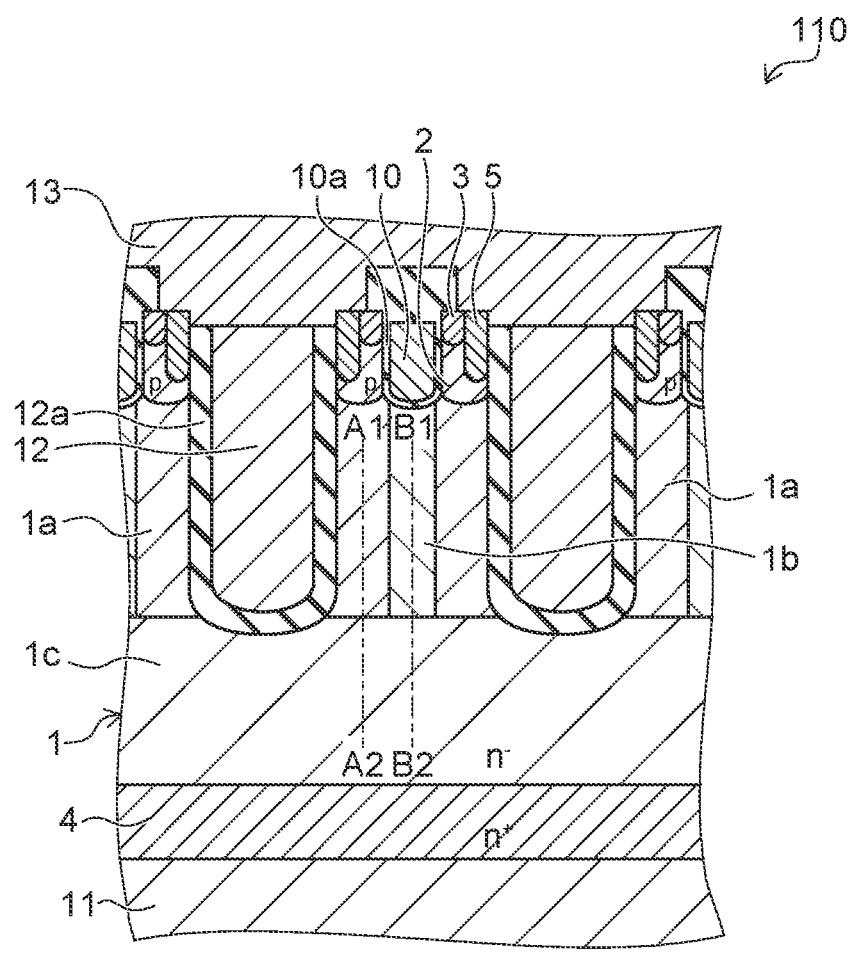
FIG. 10 is a cross-sectional view illustrating a portion of a semiconductor device according to a first modification of the first embodiment.
Figure 10:
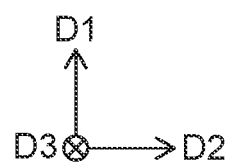

FIG. 10 is a cross-sectional view illustrating a portion of a semiconductor device according to a first modification of the first embodiment.

Figure 11A:
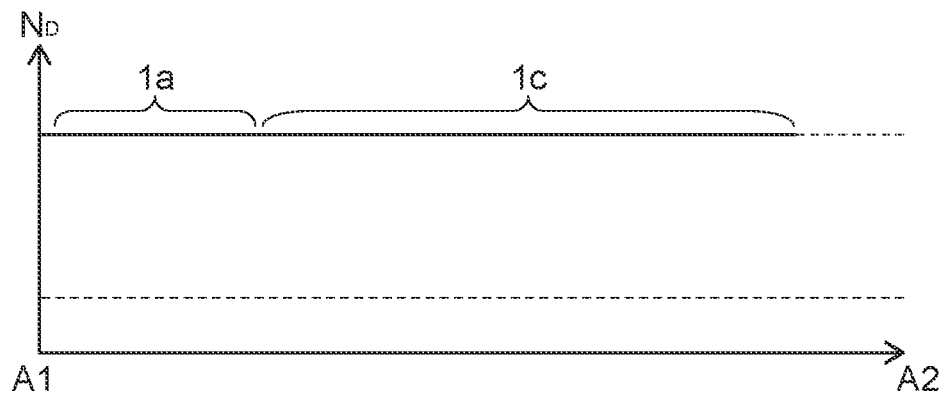
FIG. 11A and FIG. 11B respectively are graphs illustrating distributions of an n-type impurity concentration ND along line A1-A2 and line B1-B2 of FIG. 10.
Figure 11B:
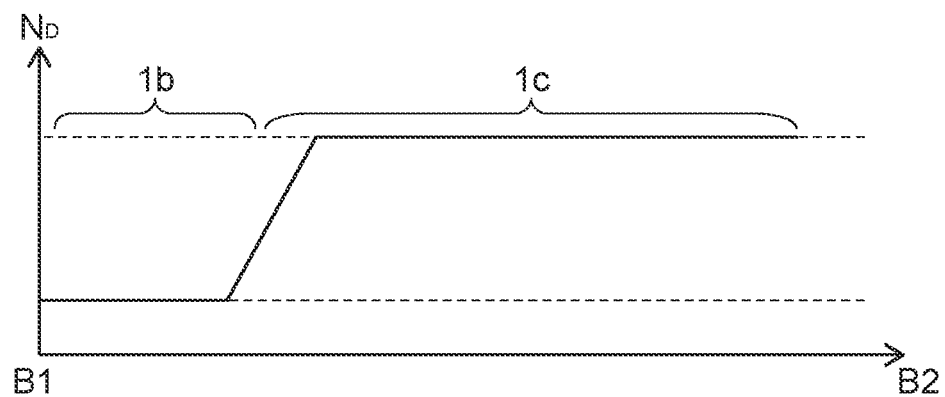

FIG. 11A and FIG. 11B respectively are graphs illustrating distributions of the n-type impurity concentration ND along line A1-A2 and line B1-B2 of FIG. 10.

In the semiconductor device 110 according to the first modification, the $n^-$-type drift region 1 further includes a third region 1*c*. The third region 1*c* is provided between the $n^+$-type drain region 4 and the first region 1*a*, between the $n^+$-type drain region 4 and the second region 1*b*, and between the $n^+$-type drain region 4 and the FP electrode 12.

As illustrated in FIG. 11B, the n-type impurity concentration in the third region 1*c* is higher than the n-type impurity concentration in the second region 1*b*. For example, as illustrated in FIG. 11A, the n-type impurity concentration in the third region 1*c* is the same as the n-type impurity concentration in the first region 1a. Or, the n-type impurity concentration in the third region 1c may be lower than the n-type impurity concentration in the first region 1a.

The ON-resistance of the semiconductor device 110 can be reduced compared to the semiconductor device 100 by providing the third region 1c having the higher n-type impurity concentration under the first region 1a, the second region 1b, and the FP electrode 12.

By providing the third region 1c, the breakdown voltage of the semiconductor device 110 is reduced compared to the semiconductor device 100. To adjust the reduction amount of the breakdown voltage and the ON-resistance, the third region 1c may be provided selectively between the n$^+$-type drain region 4 and the first region 1a, between the n$^+$-type drain region 4 and the second region 1b, and between the n$^+$-type drain region 4 and the FP electrode 12.

Second Modification

Figure 12A:
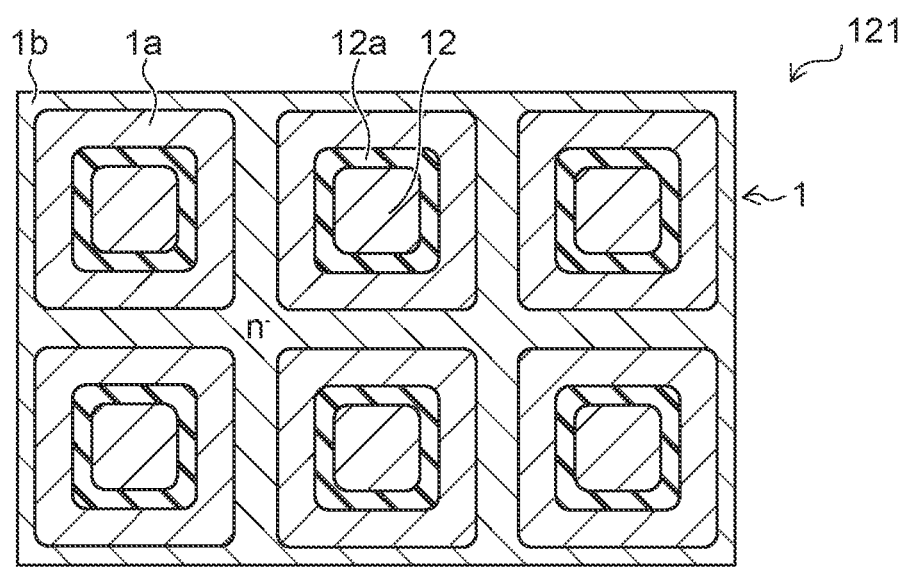
FIG. 12A to FIG. 12C are plan views illustrating portions of semiconductor devices according to a second modification of the first embodiment.
Figure 12B:
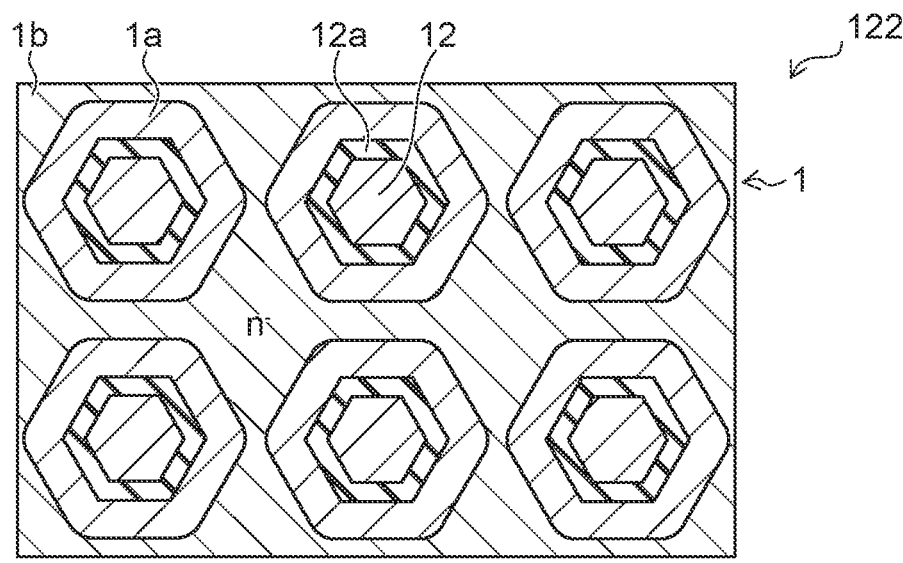
Figure 12C:
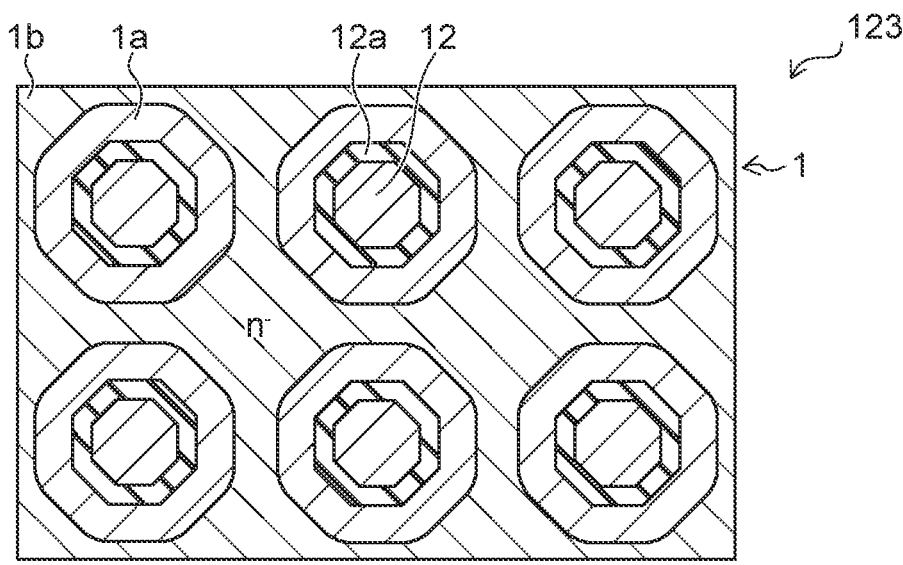

FIG. 12A to FIG. 12C are plan views illustrating portions of semiconductor devices according to a second modification of the first embodiment.

FIG. 12A to FIG. 12C illustrate structures of a cross section passing through the n$^-$-type drift region 1 and the FP electrode 12 parallel to the second direction D2 and the third direction D3.

In the semiconductor devices 100 and 110, the FP electrode 12 has a circular configuration when viewed from the first direction D1. Conversely, in a semiconductor device 121 illustrated in FIG. 12A, the FP electrode 12 has a quadrilateral configuration when viewed from the first direction D1. In a semiconductor device 122 illustrated in FIG. 12B, the FP electrode 12 has a hexagonal configuration when viewed from the first direction D1. In a semiconductor device 123 illustrated in FIG. 12C, the FP electrode 12 has an octagonal configuration when viewed from the first direction D1.

In all of these structures, the multiple first regions 1a are provided respectively around the multiple FP electrodes 12. The second region 1b is provided around the multiple first regions 1a. It is possible to reduce the ON-resistance and increase the breakdown voltage thereby. In other words, as long as the first region 1a and the second region 1b are provided, the specific structure of the FP electrode 12 is modifiable as appropriate.

Third Modification

Figure 13:
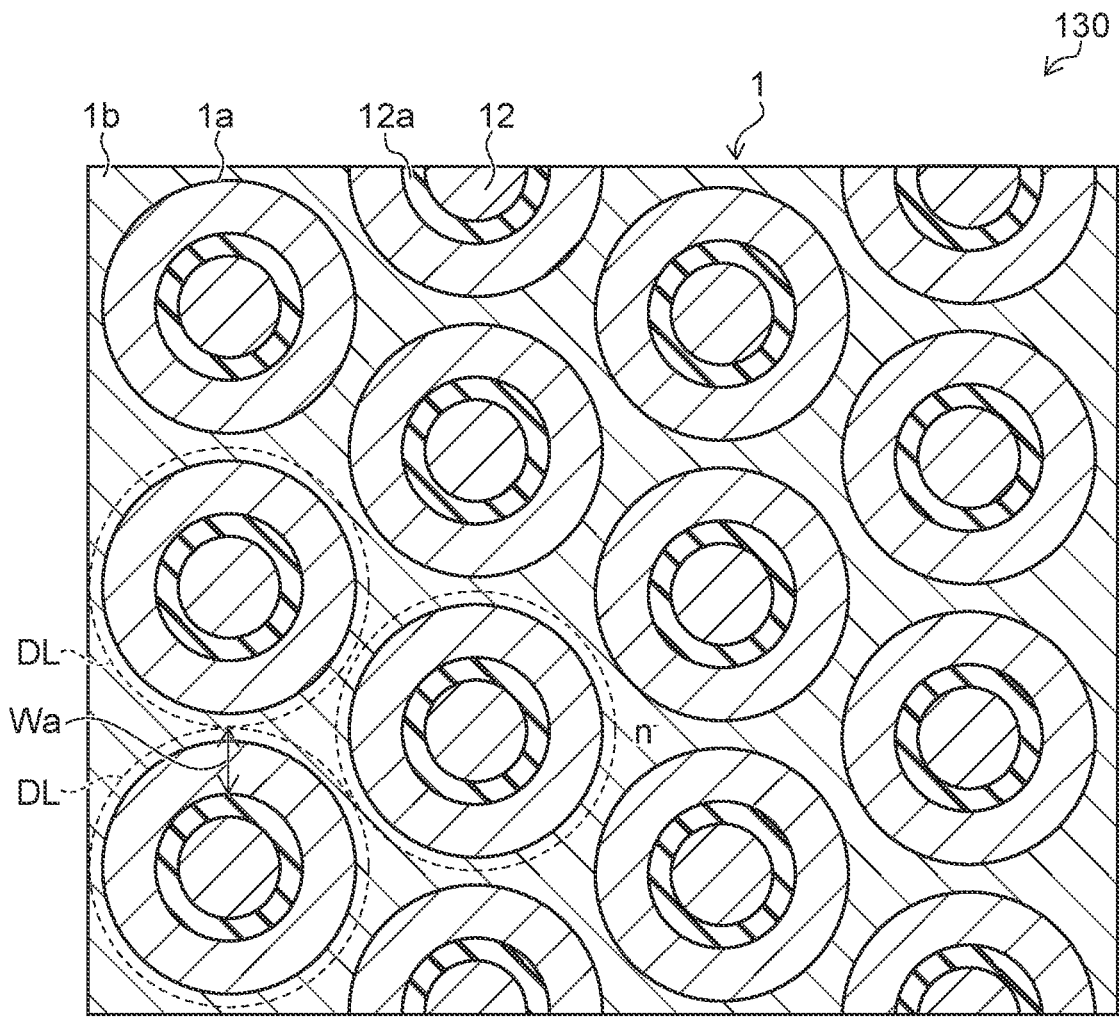
FIG. 13 is a plan view illustrating a portion of a semiconductor device according to a third modification of the first embodiment.
Figure 13:
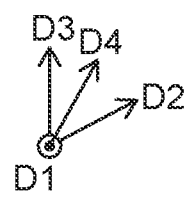

FIG. 13 is a plan view illustrating a portion of a semiconductor device according to a third modification of the first embodiment.

FIG. 13 illustrates the structure of the semiconductor device in a cross section passing through the n$^-$-type drift region 1 and the FP electrode 12 along the second direction D2 and the third direction D3.

In the semiconductor device 130 illustrated in FIG. 13, the second direction D2 and the third direction D3 which are the arrangement directions of the FP electrodes 12 are not orthogonal to each other. In the example of FIG. 13, the angle between the second direction D2 and the third direction D3 is 60 degrees; and the FP electrodes 12 are arranged in a staggered configuration.

When the depletion layer DL which has the width Wa spreads in the semiconductor device 130, the n$^-$-type drift region 1 between the FP electrodes 12 is depleted in the second direction D2 or the third direction D3. On the other hand, in the fourth direction D4 which crosses the second direction D2 and the third direction D3, the n$^-$-type drift region 1 is not depleted completely even when the depletion layer having the width Wa spreads. Therefore, in the semiconductor device 130 as well, it is effective to provide the first region 1a and the second region 1b in the n$^-$-type drift region 1. By providing the first region 1a and the second region 1b, the depletion layer spreads easily in the fourth direction D4 while suppressing the increase of the ON-resistance. It is possible to increase the breakdown voltage and reduce the ON-resistance while avoiding the large ON-resistance increase and the large breakdown voltage decrease.

Fourth Modification

Figure 14:
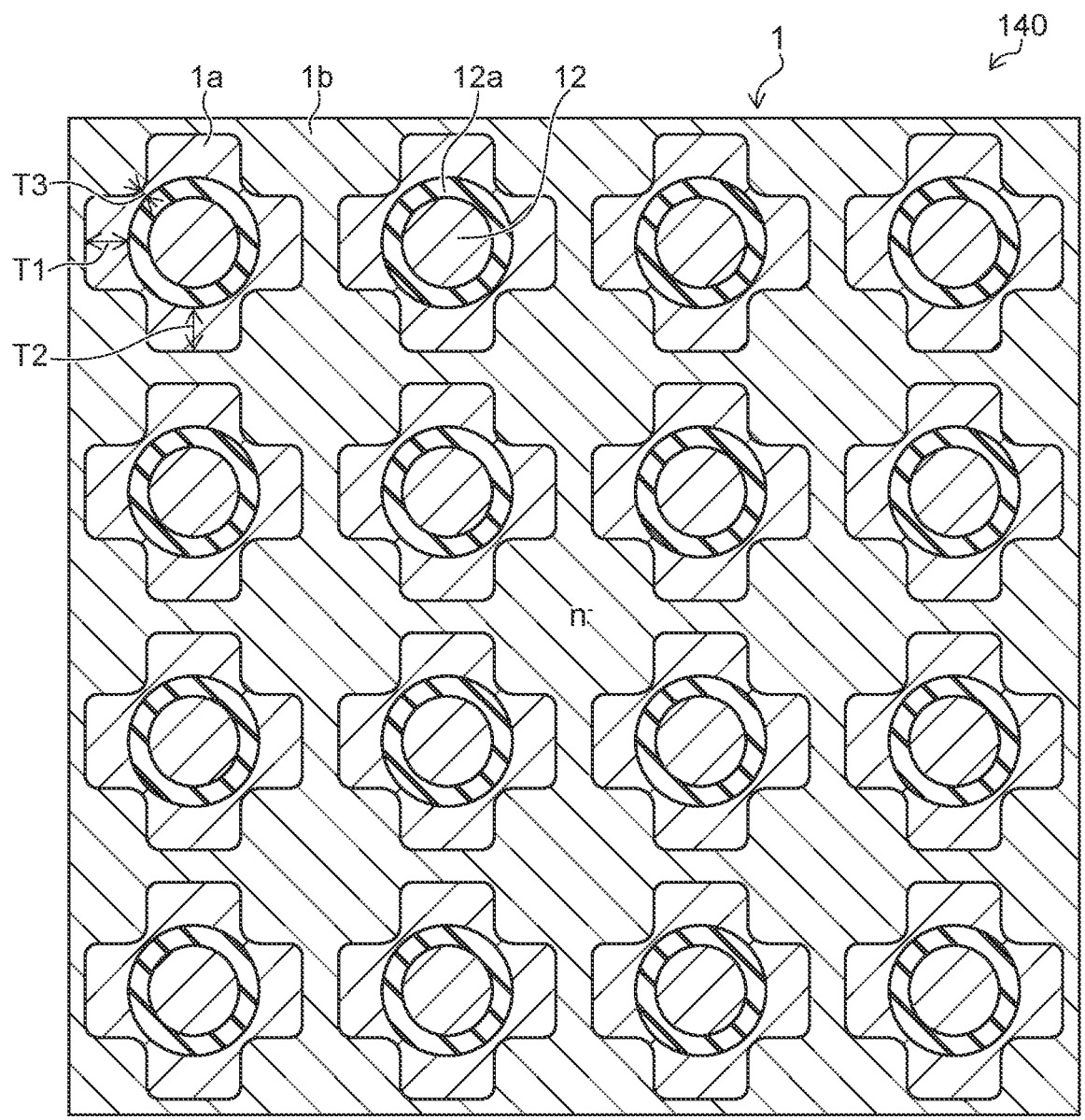
FIG. 14 is a plan view illustrating a portion of a semiconductor device according to a fourth modification of the first embodiment.

FIG. 14 is a plan view illustrating a portion of a semiconductor device according to a fourth modification of the first embodiment.

FIG. 14 illustrates the structure of a semiconductor device in a cross section passing through the n$^-$-type drift region 1 and the FP electrode 12 along the second direction D2 and the third direction D3.

In the semiconductor device 140 illustrated in FIG. 14, the thickness T1 in the second direction D2 of the first region 1a between the second region 1b and the FP electrode 12 is greater than a thickness T3 in the fourth direction D4 of the first region 1a. Also, a thickness T2 in the third direction D3 of the first region 1a is greater than the thickness T3.

In the semiconductor device 140, the proportion of the thickness of the first region 1a to the distance Di1 between the FP electrodes 12 adjacent to each other in the fourth direction D4 is small compared to that of the semiconductor device 100. Therefore, in the semiconductor device 140, the depletion layer spreads easily in the fourth direction D4 compared to that of the semiconductor device 100.

In the semiconductor device 100, the thickness of the first region 1a is substantially uniform around the FP electrode 12. Therefore, the spreading of the depletion layer in the fourth direction D4 is suppressed by increasing the n-type impurity concentration in the first region 1a. Conversely, in the semiconductor device 140, the thickness of the first region 1a in the fourth direction D4 is small. Therefore, the spreading of the depletion layer in the fourth direction D4 is not suppressed easily even when the n-type impurity concentration in the first region 1a is increased. Therefore, according to the fourth modification, the ON-resistance of the semiconductor device 140 can be reduced further while maintaining the breakdown voltage.

Second Embodiment

Figure 15:
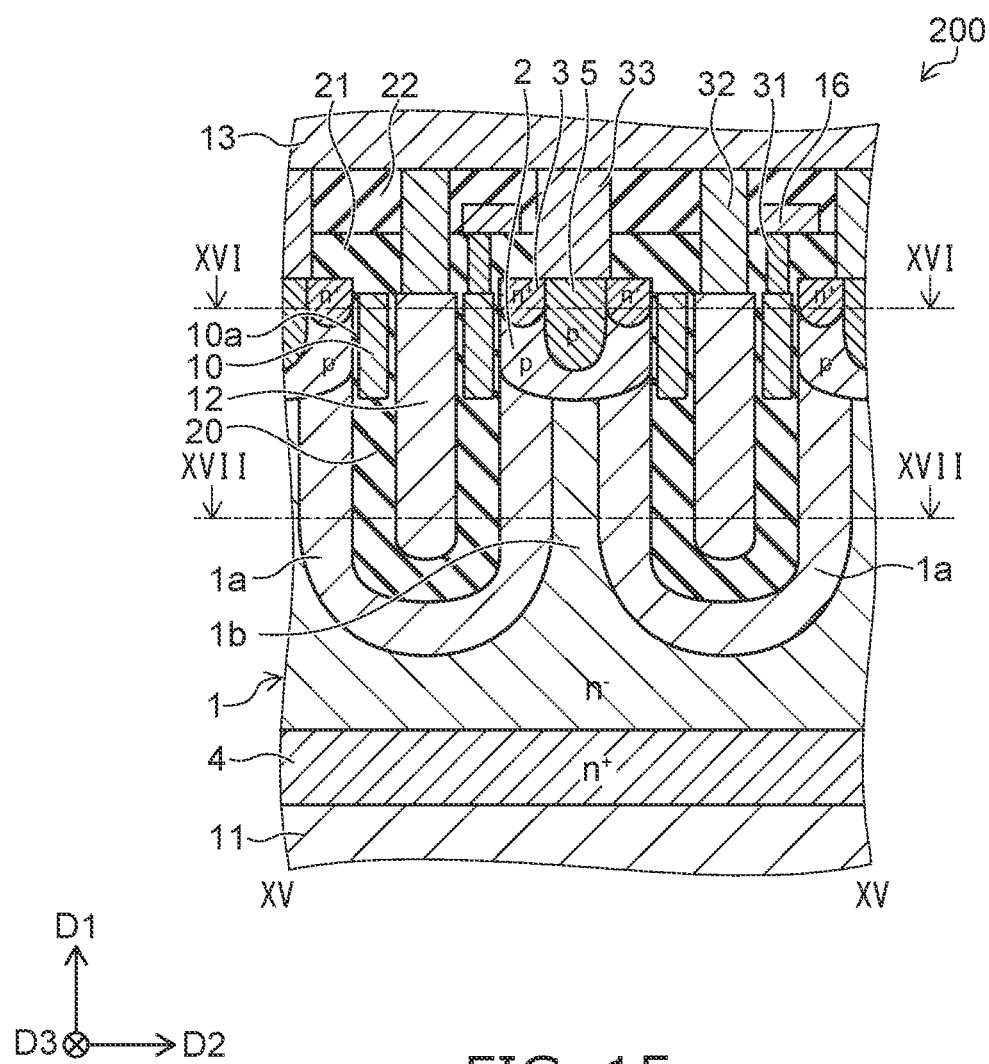
FIG. 15 to FIG. 17 are cross-sectional views illustrating portions of a semiconductor device according to a second embodiment.
Figure 16:
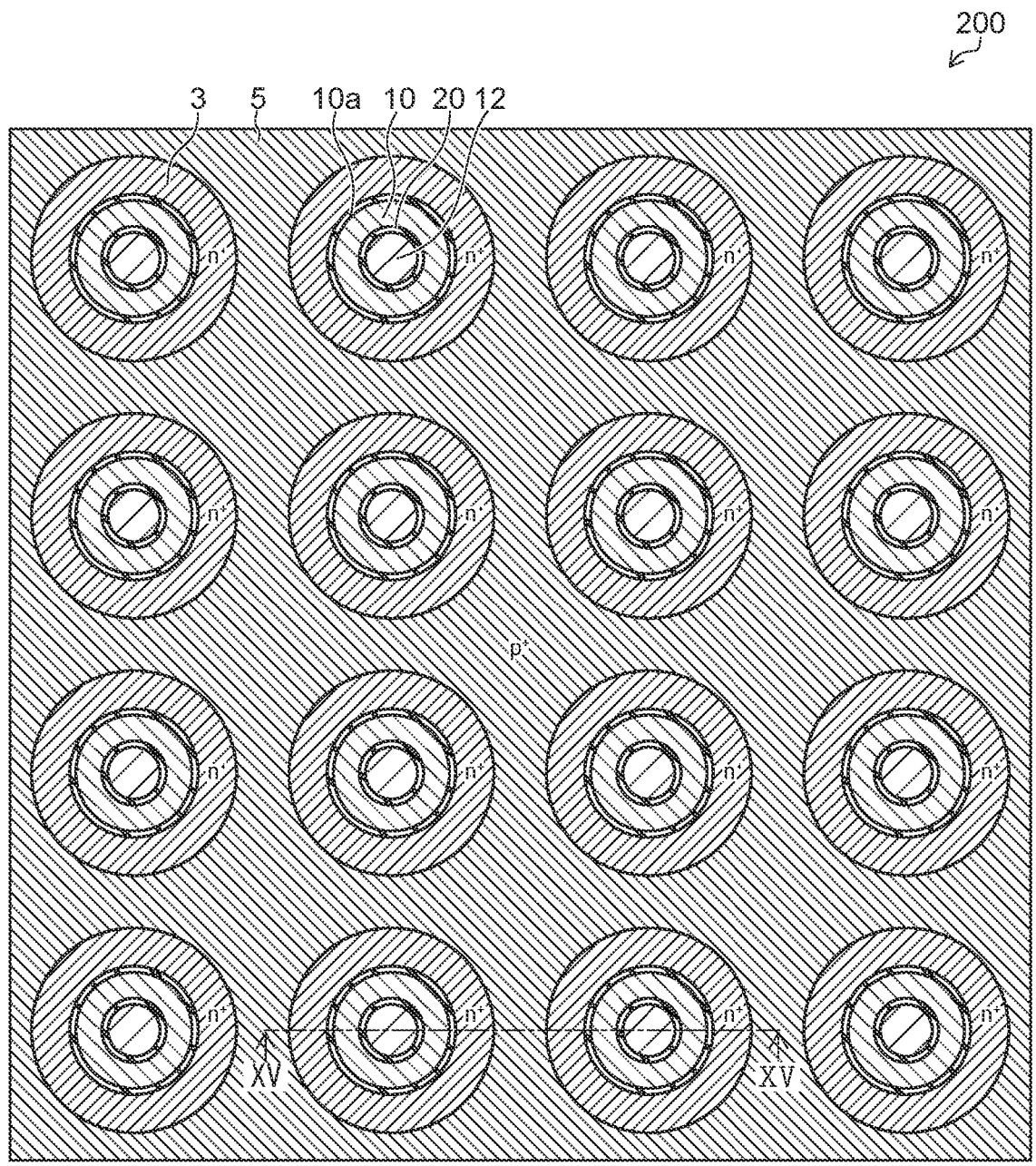
Figure 17:
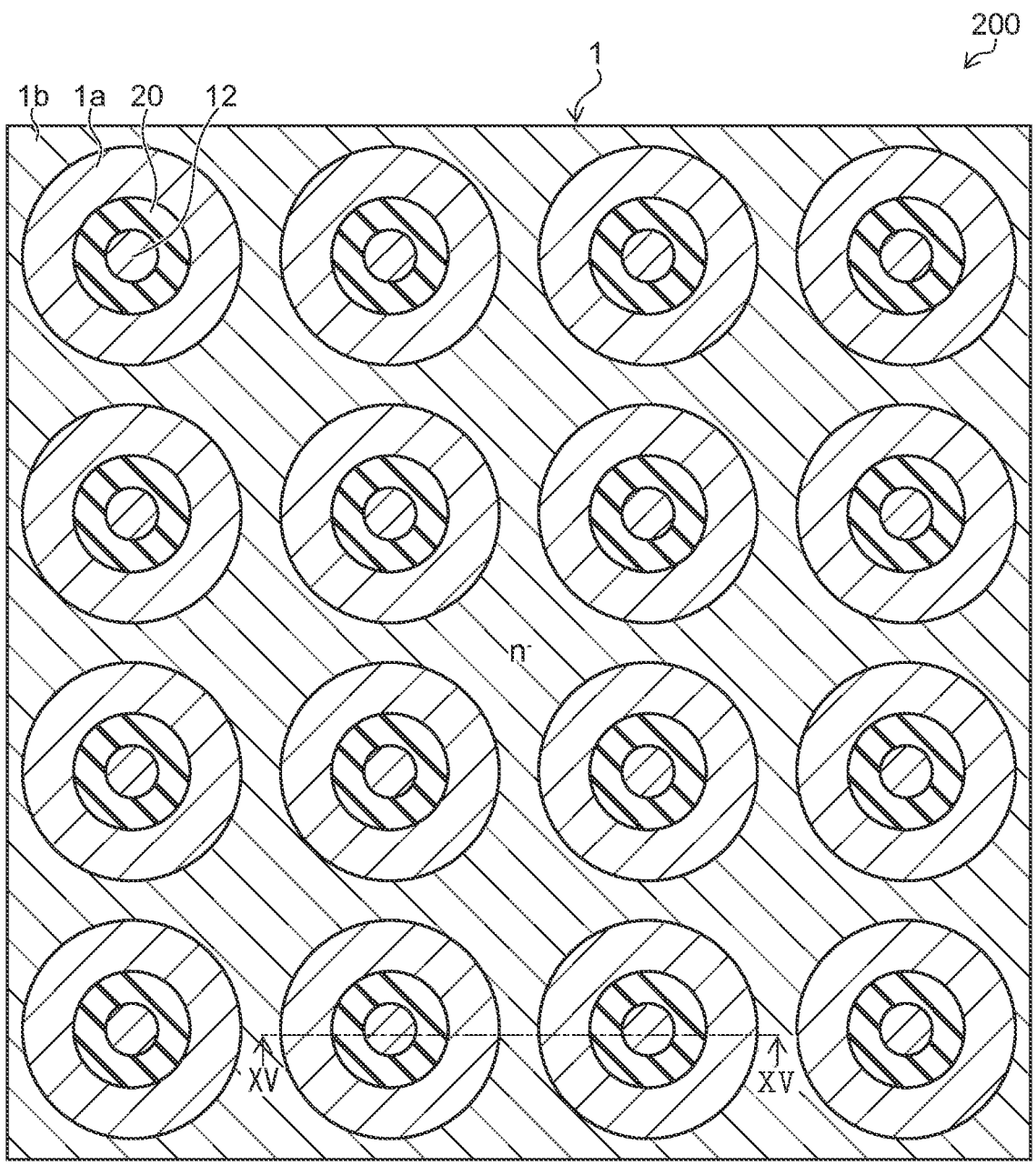

FIG. 15 to FIG. 17 are cross-sectional views illustrating portions of a semiconductor device according to a second embodiment.

FIG. 15 is a XV-XV cross-sectional view of FIG. 16 and FIG. 17. FIG. 16 is a XVI-XVI cross-sectional view of FIG. 15. FIG. 17 is a XVII-XVII cross-sectional view of FIG. 15.

As illustrated in FIG. 15 to FIG. 17, the semiconductor device 200 according to the second embodiment includes the n$^-$-type drift region 1 (the first semiconductor region), the p-type base region 2 (the second semiconductor region), the n$^+$-type source region 3 (the third semiconductor region), the n$^+$-type drain region 4, the p$^+$-type contact region 5, the drain electrode 11 (the first electrode), the FP electrode 12 (the second electrode), the source electrode 13 (the third electrode), an insulating portion 20, insulating layers 21 and 22, and connectors 31 to 33.

For example, the structure of the upper surface of the semiconductor device 200 is similar to that of the semiconductor device 100 illustrated in FIG. 1. As illustrated in FIG. 15, the drain electrode 11 is provided at the lower surface of the semiconductor device 200. The n⁺-type drain region 4 and the n⁻-type drift region 1 are provided on the drain electrode 11.

The insulating portion 20 is provided on a portion of the n⁻-type drift region 1. The p-type base region 2 is provided on another portion of the n⁻-type drift region 1. The n⁺-type source region 3 and the p⁺-type contact region 5 are provided selectively on the p-type base region 2. The n⁺-type source region 3 is positioned around the insulating portion 20 in the second direction D2 and the third direction D3.

The gate electrode 10 and the FP electrode 12 are provided inside the insulating portion 20. The gate electrode 10 opposes the p-type base region 2 in the second direction D2 and the third direction D3 with the gate insulating layer 10a, which is a portion of the insulating portion 20, interposed.

A portion of the FP electrode 12 opposes the n⁻-type drift region 1 in the second direction D2 and the third direction D3. Also, another portion of the FP electrode 12 opposes the gate electrode 10 in the second direction D2 and the third direction D3. A portion of the insulating portion 20 is provided between the gate electrode 10 and the FP electrode 12. Thereby, the gate electrode 10 and the FP electrode 12 are electrically isolated from each other.

An interconnect layer 16 is provided on the gate electrode with the insulating layer 21 interposed. The connector 31 is provided between the gate electrode 10 and the interconnect layer 16 and electrically connects the gate electrode 10 and the interconnect layer 16.

The source electrode 13 is provided on the interconnect layer 16 with the insulating layer 22 interposed. A connector 32 is provided between the FP electrode 12 and the source electrode 13 and electrically connects the FP electrode 12 and the source electrode 13. The connector 33 is provided between the n⁺-type source region 3 and the source electrode 13 and between the p⁺-type contact region 5 and the source electrode 13 and electrically connects the n⁺-type source region 3 and the p⁺-type contact region 5 to the source electrode 13. In other words, the connector 33 electrically connects the n⁺-type source region 3 and the p⁺-type contact region 5 to the source electrode 13 at a position where the interconnect layer 16 is not provided.

In the semiconductor device 200 as illustrated in FIG. 16 and FIG. 17, multiple gate electrodes 10, multiple FP electrodes 12, and multiple insulating portions 20 are provided in the second direction D2 and the third direction D3. The gate electrode 10 has a ring configuration when viewed from the first direction D1. The FP electrode 12 is positioned at the inner side of the gate electrode 10. The p-type base region 2 and the n⁺-type source regions 3 are provided around the insulating portions 20 in the second direction D2 and the third direction D3.

As illustrated in FIG. 15, multiple interconnect layers 16 are provided in the third direction D3. For example, each of the interconnect layers 16 extends in the second direction D2 and is provided on the gate electrodes 10 arranged in the second direction D2. The source electrode 13 is provided on the multiple interconnect layers 16 with the insulating layer 22 interposed.

In the semiconductor device 200 as illustrated in FIG. 17, similarly to the semiconductor device 100, the n⁻-type drift region 1 includes the multiple first regions 1a and the second region 1b. Therefore, according to the second embodiment, similarly to the first embodiment, it is possible to increase the breakdown voltage and reduce the ON-resistance while avoiding the large ON-resistance increase and the large breakdown voltage decrease.

Portions of the first regions 1a are provided between the drain electrode 11 and the multiple FP electrodes 12 in the first direction D1. In other words, the first regions 1a are provided also at the bottom portion vicinities of the insulating portions 20. Therefore, the electrical resistance of the n⁻-type drift region 1 in the ON-state can be reduced; and the ON-resistance of the semiconductor device 100 can be reduced further.

Modification

Figure 18:
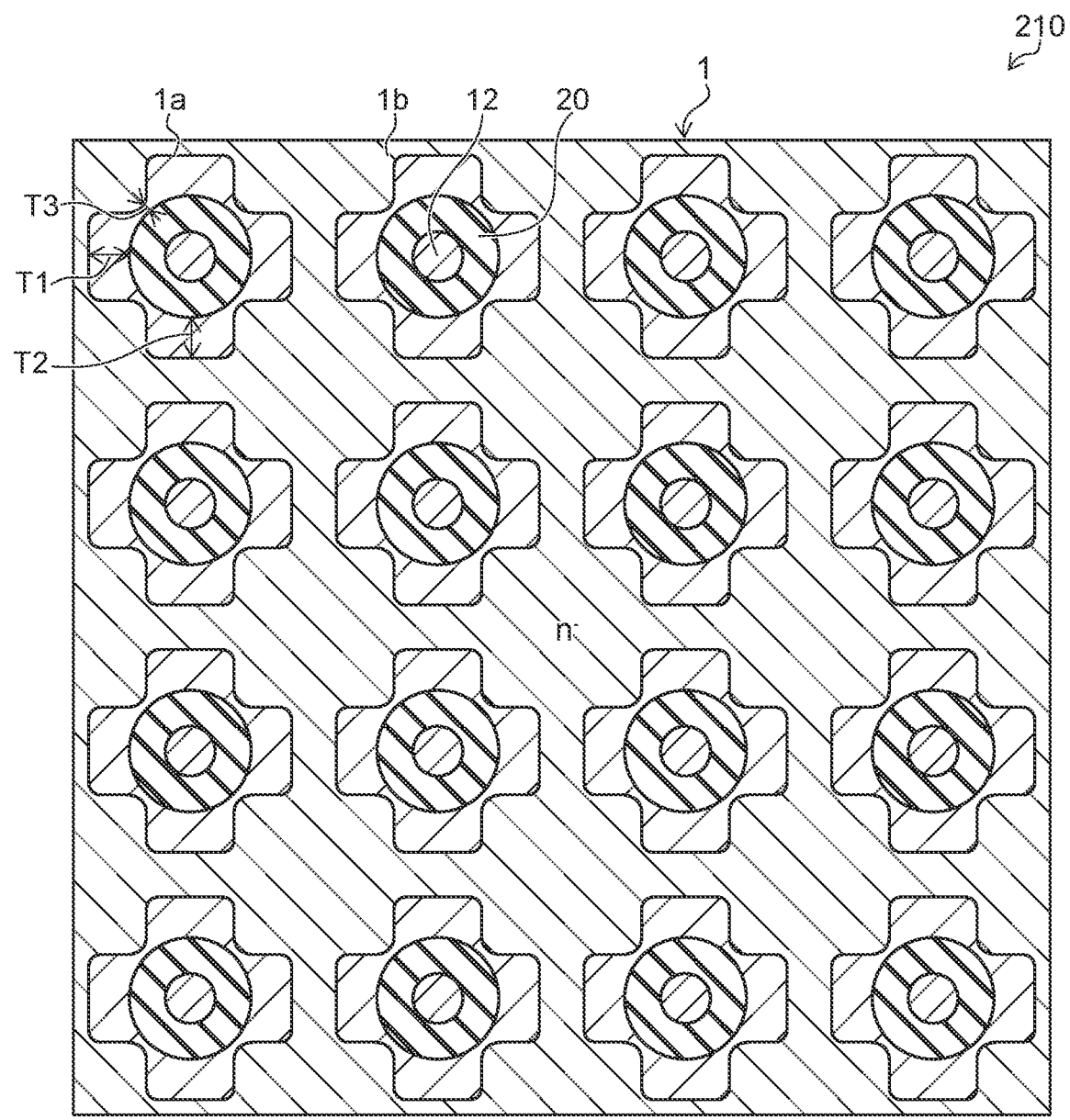
FIG. 18 is a cross-sectional view illustrating a portion of a semiconductor device according to a modification of the second embodiment.

FIG. 18 is a cross-sectional view illustrating a portion of a semiconductor device according to a modification of the second embodiment.

FIG. 18 illustrates the structure of a cross section passing through the n⁻-type drift region 1 and the FP electrode 12 parallel to the second direction D2 and the third direction D3.

In the semiconductor device 210 illustrated in FIG. 18, the thickness T1 in the second direction D2 of the first region 1a between the second region 1b and the insulating portion 20 is greater than the thickness T3 in the fourth direction D4 of the first region 1a. The thickness T2 in the third direction D3 of the first region 1a also is greater than the thickness T3.

In the semiconductor device 210, the proportion of the thickness of the first region 1a to the distance Di1 between the insulating portions 20 adjacent to each other in the fourth direction D4 is small compared to that of the semiconductor device 200. Therefore, the depletion layer spreads easily in the fourth direction D4 in the semiconductor device 210 compared to the semiconductor device 200. Accordingly, according to the modification, similarly to the fourth modification of the first embodiment, the ON-resistance of the semiconductor device 210 can be reduced further while maintaining the breakdown voltage.

In the semiconductor device 200 or 210 according to the second embodiment, similarly to the third modification of the first embodiment, the FP electrode 12 may have a polygonal configuration when viewed from the first direction D1. In such a case, for example, the gate electrode 10 has a quadrilateral tubular configuration along the outer edge of the FP electrode 12.

Or, similarly to the fourth modification of the first embodiment, the multiple FP electrodes 12 may be provided in a staggered configuration in the semiconductor device 200 or 210 according to the second embodiment. In such a case, the multiple gate electrodes 10 also are arranged similarly in a staggered configuration.

In the semiconductor device 200 or 210 according to the second embodiment, as long as the first region 1a and the second region 1b are provided, the specific structures of the gate electrodes 10 and the FP electrodes 12 are modifiable as appropriate.

The relative level of the impurity concentration between the semiconductor regions in each of the embodiments described above can be confirmed using, for example, an SCM (scanning capacitance microscope). The carrier concentration in each semiconductor region can be regarded as being equal to the impurity concentration activated in each semiconductor region. Therefore, the relative level of the carrier concentration between the semiconductor regions can also be confirmed using the SCM. The impurity concentration in each semiconductor region can be measured by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The embodiments described above can be embodied by combining one another.

What is claimed is:

1. A semiconductor device, comprising:
   a first electrode;
   a first semiconductor region provided on the first electrode and electrically connected to the first electrode, the first semiconductor region being of a first conductivity type;
   a second electrode opposing a portion of the first semiconductor region in a second direction and a third direction with an insulating layer interposed, the second direction being perpendicular to a first direction from the first electrode toward the first semiconductor region, the third direction being perpendicular to the first direction and crossing the second direction, the second electrode having a circular configuration when viewed from the first direction;
   a gate electrode provided in a grid pattern and enclosing a portion of the second electrodes along a first plane parallel to the second direction and the third direction;
   a second semiconductor region opposing the gate electrode with a gate insulating layer interposed, being provided between the gate electrode and the second electrode, and being of a second conductivity type;
   a third semiconductor region provided on the second semiconductor region, the third semiconductor region being of the first conductivity type; and
   a third electrode provided on the second semiconductor region and the third semiconductor region and electrically connected to the second semiconductor region, the third semiconductor region, and the second electrode,
   wherein
   the third electrode includes a contact portion,
   a lower surface of the contact portion directly contacts with the second electrode, and
   a length in the third direction of the contact portion is longer than a length in the third direction of the second electrode.

2. The semiconductor device according to claim 1, further comprising a fourth semiconductor region of the second conductivity type,
   the fourth semiconductor region being located between the second electrode and the third semiconductor region,
   the third semiconductor region being located between the fourth semiconductor region and the gate electrode.

3. The semiconductor device according to claim 2, wherein
   an upper end of the gate electrode is arranged with a portion of the fourth semiconductor region in the second direction.

4. The semiconductor device according to claim 2, wherein
   a lower end of the fourth semiconductor region is located below a lower end of the third semiconductor region and located above a lower end of the gate electrode.

5. The semiconductor device according to claim 1, wherein
   the second semiconductor region has a first boundary surface in contact with the first semiconductor region,
   the first boundary surface includes a first part and a second part,
   a distance in the second direction between the first part and the gate electrode is longer than a distance in the second direction between the second part and the gate electrode, and
   the first part is located below the second part.

6. The semiconductor device according to claim 5, wherein
   the second part is located above a lower end of the gate electrode.

7. The semiconductor device according to claim 5, wherein
   the second part is located directly below the third semiconductor region.

8. The semiconductor device according to claim 5, wherein
   a pair of the second semiconductor regions is provided, and
   the gate electrode is located between the pair of the second semiconductor regions in the second direction.

9. The semiconductor device according to claim 8, wherein
   one of the pair of the second semiconductor regions has the first boundary surface,
   the other one of the pair of the second semiconductor regions has a second boundary surface in contact with the first semiconductor region,
   the second boundary surface includes a third part and a fourth part,
   a distance in the second direction between the third part and the gate electrode is longer than a distance in the second direction between the fourth part and the gate electrode, and
   the third part is located below the fourth part.

10. The semiconductor device according to claim 1, wherein
    a length in the first direction of the gate electrode is longer than a length in the second direction of the second semiconductor region.

11. The semiconductor device according to claim 1, wherein
    the third electrode includes a contact portion,
    a lower surface of the contact portion directly contacts with the second electrode, and
    a length in the third direction of the contact portion is longer than a length in the third direction of the second electrode.

12. The semiconductor device according to claim 1, wherein
    an outer perimeter of the insulating layer has a circular configuration when viewed from the first direction.

13. A semiconductor device, comprising:
    a first electrode;
    a first semiconductor region provided on the first electrode and electrically connected to the first electrode, the first semiconductor region being of a first conductivity type;
    a second electrode opposing a portion of the first semiconductor region in a second direction and a third direction with an insulating layer interposed, the second direction being perpendicular to a first direction from the first electrode toward the first semiconductor region, the third direction being perpendicular to the first direction and crossing the second direction, the second electrode having a circular configuration when viewed from the first direction;

a gate electrode provided in a grid pattern and enclosing a portion of the second electrodes along a first plane parallel to the second direction and the third direction;

a second semiconductor region opposing the gate electrode with a gate insulating layer interposed, being provided between the gate electrode and the second electrode, and being of a second conductivity type;

a third semiconductor region provided on the second semiconductor region, the third semiconductor region being of the first conductivity type; and a third electrode provided on the second semiconductor region and the third semiconductor region and electrically connected to the second semiconductor region, the third semiconductor region, and the second electrode, wherein a distance in the second direction between the second electrode and the gate electrode is shorter than a distance in a fourth direction between the second electrode and the gate electrode, and the fourth direction is perpendicular to the first direction and crosses the second direction and the third direction.

14. The semiconductor device according to claim 13, further comprising a fourth semiconductor region of the second conductivity type, the fourth semiconductor region being located between the second electrode and the third semiconductor region, the third semiconductor region being located between the fourth semiconductor region and the gate electrode.

15. The semiconductor device according to claim 14, wherein an upper end of the gate electrode is arranged with a portion of the fourth semiconductor region in the second direction.

16. The semiconductor device according to claim 14, wherein a lower end of the fourth semiconductor region is located below a lower end of the third semiconductor region and located above a lower end of the gate electrode.

17. The semiconductor device according to claim 13, wherein the second semiconductor region has a first boundary surface in contact with the first semiconductor region, the first boundary surface includes a first part and a second part, a distance in the second direction between the first part and the gate electrode is longer than a distance in the second direction between the second part and the gate electrode, and the first part is located below the second part.

18. The semiconductor device according to claim 17, wherein the second part is located above a lower end of the gate electrode.

19. The semiconductor device according to claim 14, wherein a plurality of the second semiconductor regions is respectively provided between the plurality of second electrodes and the gate electrode, and a plurality of the third semiconductor regions is respectively provided on the plurality of second semiconductor regions.

20. A semiconductor device, comprising:

a first electrode;

a first semiconductor region provided on the first electrode and electrically connected to the first electrode, the first semiconductor region being of a first conductivity type;

a second electrode opposing a portion of the first semiconductor region in a second direction and a third direction with an insulating layer interposed, the second direction being perpendicular to a first direction from the first electrode toward the first semiconductor region, the third direction being perpendicular to the first direction and crossing the second direction, the second electrode having a circular configuration when viewed from the first direction;

a gate electrode provided in a grid pattern and enclosing a portion of the second electrodes along a first plane parallel to the second direction and the third direction;

a second semiconductor region opposing the gate electrode with a gate insulating layer interposed, being provided between the gate electrode and the second electrode, and being of a second conductivity type;

a third semiconductor region provided on the second semiconductor region, the third semiconductor region being of the first conductivity type; and a third electrode provided on the second semiconductor region and the third semiconductor region and electrically connected to the second semiconductor region, the third semiconductor region, and the second electrode, wherein a plurality of the second electrodes is provided in the second direction and the third direction, the gate electrode is located around each of the plurality of second electrodes along the first plane, the plurality of second electrodes includes a pair of the second electrodes adjacent with each other in a fourth direction, the fourth direction is perpendicular to the first direction and crosses the second direction and the third direction, and the gate electrode includes a crossing part located between the pair of the second electrodes, a length in the fourth direction of the crossing part is longer than a length in the second direction of the crossing part.

* * * * *